(12) United States Patent
Oh et al.

(10) Patent No.: US 9,490,177 B2
(45) Date of Patent: Nov. 8, 2016

(54) INTEGRATED CIRCUIT DEVICES INCLUDING STRESS PROXIMITY EFFECTS AND METHODS OF FABRICATING THE SAME

(75) Inventors: Chang-Woo Oh, Suwon-si (KR); Myung-Gil Kang, Seoul (KR); Young-Chai Jung, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 321 days.

(21) Appl. No.: 13/617,582

(22) Filed: Sep. 14, 2012

(65) Prior Publication Data

US 2013/0285143 A1    Oct. 31, 2013

(30) Foreign Application Priority Data

Apr. 25, 2012 (KR) .................. 10-2012-0043279

(51) Int. Cl.
*H01L 21/70*     (2006.01)
*H01L 21/8238*   (2006.01)
*H01L 27/092*    (2006.01)
*H01L 29/66*     (2006.01)
*H01L 29/78*     (2006.01)

(52) U.S. Cl.
CPC ... *H01L 21/823821* (2013.01); *H01L 27/0924* (2013.01); *H01L 29/66636* (2013.01); *H01L 29/7848* (2013.01)

(58) Field of Classification Search
CPC .............. H01L 21/823821; H01L 21/823814; H01L 21/823807; H01L 29/7848; H01L 29/66636; H01L 29/7835; H01L 29/78696; H01L 29/66659; H01L 29/66628; H01L 29/66795; H01L 29/785; H01L 27/0924; H01L 21/02532
USPC ........ 257/347, 369, 408; 438/154, 199, 268, 438/286, 300
See application file for complete search history.

(56) References Cited

U.S. PATENT DOCUMENTS

| | | | |
|---|---|---|---|
| 7,939,413 B2 | 5/2011 | Chong et al. | |
| 2006/0043616 A1* | 3/2006 | Anderson et al. | 257/900 |
| 2007/0045729 A1* | 3/2007 | Hoentschel | H01L 21/823814 257/344 |
| 2009/0032880 A1 | 2/2009 | Kawaguchi et al. | |
| 2011/0210402 A1* | 9/2011 | Anderson | H01L 21/82345 257/392 |
| 2011/0269287 A1* | 11/2011 | Tsai | H01L 21/2254 438/306 |
| 2011/0291201 A1* | 12/2011 | Cheng | H01L 21/26513 257/392 |
| 2012/0001238 A1* | 1/2012 | Tsai et al. | 257/255 |
| 2012/0313178 A1* | 12/2012 | Liao | H01L 29/66545 257/368 |

* cited by examiner

*Primary Examiner* — Khiem D Nguyen
(74) *Attorney, Agent, or Firm* — Myers Bigel & Sibley, P.A.

(57) ABSTRACT

An integrated circuit can include first and second FETs of a particular conductivity type on a substrate, wherein a first source/drain region of the first FET is closer to a center of a first channel region of the first FET than a second source/drain region of the second FET is to a center of a second channel region of the second FET.

37 Claims, 34 Drawing Sheets

INTEGRATED CIRCUIT DEVICES INCLUDING STRESS PROXIMITY EFFECTS AND METHODS OF FABRICATING THE SAME

This application claims priority from Korean Patent Application No. 10-2012-0043279 filed on Apr. 25, 2012 in the Korean Intellectual Property Office, the disclosure of which is incorporated herein by reference in its entirety.

BACKGROUND

1. Field of the Inventive Concept

The present inventive concept relates to integrated circuit devices and methods of fabricating the same.

2. Description of the Related Art

Multi-gate transistors have been suggested as one of the scaling technologies for increasing the density of a semiconductor device. In a multi-gate transistor, a fin-shaped silicon body is formed on a substrate, and a gate is formed on the surface of the silicon body.

Since the multi-gate transistor uses a 3D channel, scaling may be more easily provided. In addition, the current control capability of the multi-gate transistor can be improved even without an increase in a gate length of the multi-gate transistor. Furthermore, a short channel effect (SCE) in which the electric potential of a channel region is affected by a drain voltage can be effectively suppressed or reduced.

SUMMARY

Embodiments according to the inventive concept can provide integrated circuit devices including stress proximity effects and methods of forming the same. Pursuant to these embodiments, an integrated circuit can include first and second FETs of a particular conductivity type on a substrate, wherein a first source/drain region of the first FET is closer to a center of a first channel region of the first FET than a second source/drain region of the second FET is to a center of a second channel region of the second FET.

In some embodiments according to the inventive concept, a first interface of the first source/drain region and the first channel region is closer to the center of the first channel region than a second interface of the second source/drain region and the second channel region is to the center of the second channel region. In some embodiments according to the inventive concept, the first and second source/drain regions can have a particular lattice constant, and wherein the first source/drain region applies greater stress to the first channel region than the second source/drain region applies to the second channel region.

In some embodiments according to the inventive concept, the first source/drain region extends past an outermost lower corner of a gate structure of the first FET into the first channel region to define an undercut region beneath the first FET, wherein the second source/drain region is aligned to a gate structure of the second FET. In some embodiments according to the inventive concept, the first and second source/drain regions can be first and second raised source/drain regions, respectively, wherein the first source/drain region extends past an outermost lower corner of a gate structure of the first FET into the first channel region to define a first undercut region beneath the first FET. The second source/drain region can extend past an outermost lower corner of a gate structure of the second FET into the second channel region to define a second undercut region beneath the second FET.

In some embodiments according to the inventive concept, the first and second source/drain regions can have different lattice constants than the first and second channel regions. In some embodiments according to the inventive concept, the first and second source/drain regions can be first and second raised source/drain regions, respectively, wherein the first raised source/drain region wraps around an outermost lower corner of a gate structure of the first FET into the first channel region to define an undercut region beneath the first FET and the second source/drain region is formed aligned to a gate structure of the second FET.

In some embodiments according to the inventive concept, the first and second source/drain regions can be first and second raised source/drain regions, respectively, wherein the first raised source/drain region wraps around an outermost lower corner of a gate structure of the first FET into the first channel region to define a first undercut region beneath the first FET and the second raised source/drain region wraps around an outermost lower corner of a gate structure of the second FET into the second channel region to define a second undercut region beneath the second FET.

In some embodiments according to the inventive concept, the device can further include a first spacer including an outer side wall of a gate structure of the first FET to provide a first thickness and a second spacer including an outer side wall of a gate structure of the second FET to provide a second thickness that is greater than the first thickness. In some embodiments according to the inventive concept, the first source/drain region is formed self-aligned to the first spacer and the second source/drain region is formed self-aligned to the second spacer. In some embodiments according to the inventive concept, a number of layers included in the first spacer is less than a number of layers included in the second spacer.

In some embodiments according to the inventive concept, the first source/drain region is formed self-aligned to the first spacer and the second source/drain region is formed self-aligned to the second spacer. In some embodiments according to the inventive concept, the first and second FETs can be PMOS FETs, the first and second channel regions include a first material that can have a first lattice constant and the first and second source/drain regions include a second material that can have a second lattice constant that is greater than the first lattice constant. In some embodiments according to the inventive concept, the first material can be Si and the second material can be SiGe.

In some embodiments according to the inventive concept, the first and second FETs can be NMOS FETs, the channel regions include a first material that can have a first lattice constant and the source/drain regions of the first and second FETs include a second material that can have a second lattice constant that is less than the first lattice constant. In some embodiments according to the inventive concept, the first material can be Si and the second material can be SiC. In some embodiments according to the inventive concept, the first and second source/drain regions are both recessed below a surface of the substrate. In some embodiments according to the inventive concept, the first and second channel regions can be respective fins that extend from the substrate to protrude from a device isolation layer to provide upper side walls and a top surface of the respective fins positioned between the first and second source/drain regions, respectively.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF EMBODIMENTS ACCORDING TO THE INVENTIVE CONCEPT

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
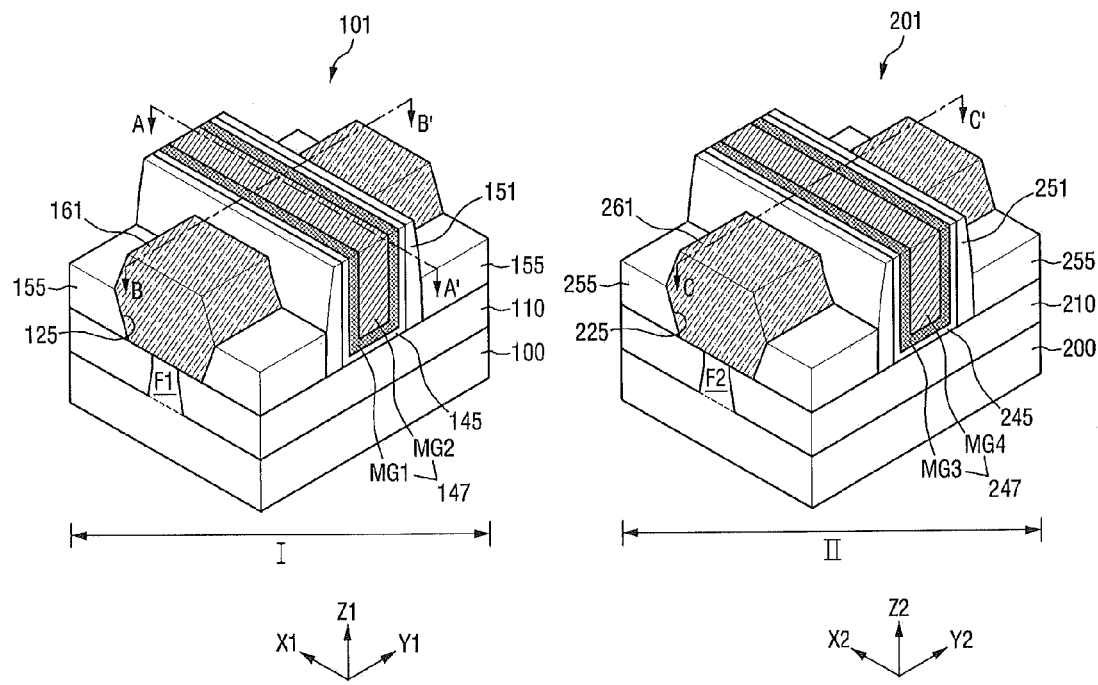
FIG. 1 is a perspective view of a semiconductor device according to an embodiment of the present inventive concept.
Figure 2:
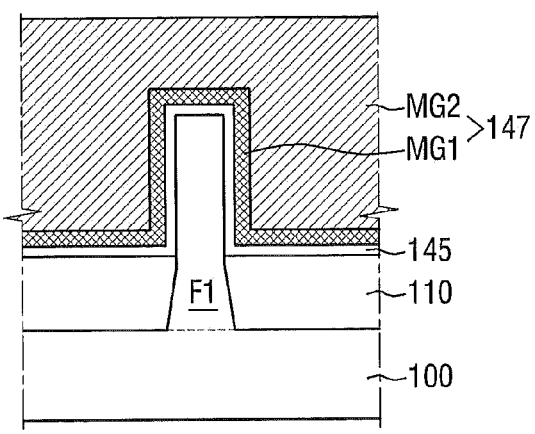
FIG. 2 is a cross-sectional view taken along the line A-A' of FIG. 1.
Figure 3:
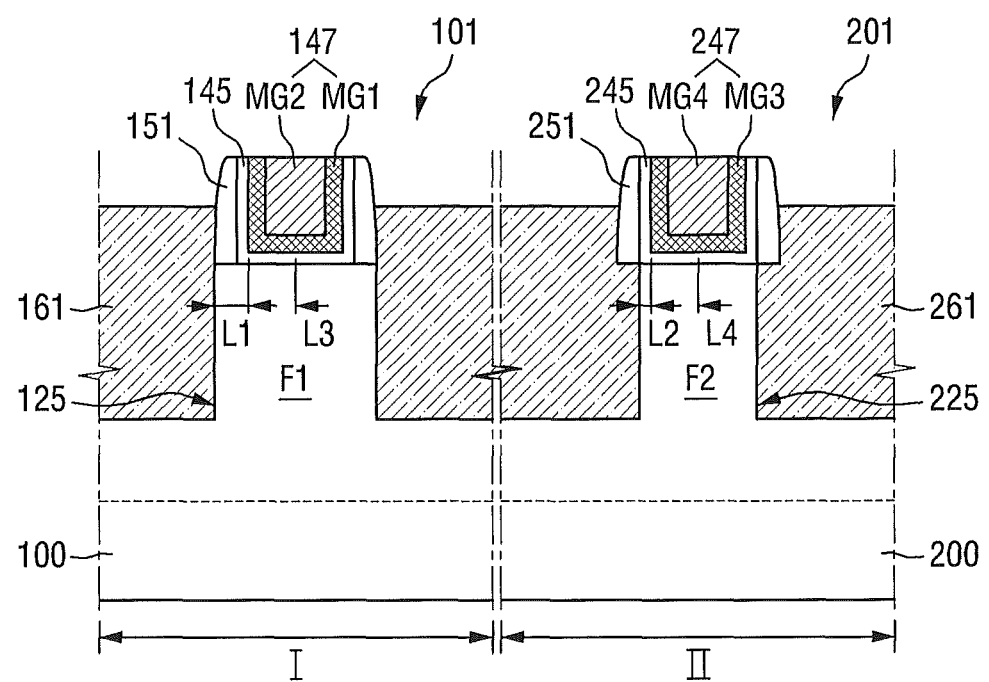
FIG. 3 is a cross-sectional view taken along the lines B-B' and C-C' of FIG. 1.

FIG. 1 is a perspective view of a semiconductor device according to a first embodiment of the present inventive concept. FIG. 2 is a cross-sectional view taken along the line A-A' of FIG. 1. FIG. 3 is a cross-sectional view taken along the lines B-B' and C-C' of FIG. 1.

Referring to FIGS. 1 through 3, a first fin transistor 101 is formed in a first region I, and a second fin transistor 201 is formed in a second region II. The first region I and the second region II may be separated or connected. The first region I may be, for example, a static random access memory (SRAM) region, and the second region II may be a logic region. Alternatively, the first region I may be a region in which a pull-up transistor of an SRAM is formed, and the second region II may be a region in which a pull-down transistor or a pass transistor of the SRAM is formed.

The first fin transistor 101 has a first stress proximity, and the second fin transistor 201 has a second stress proximity which is different from the first stress proximity. Appropriate stress applied to a channel (by, for example, different lattice constants) may improve the mobility of carriers and increase the amount of current. As appreciated by the present inventive step, how closely stress is applied to the channel (such as relative to a center of the channel) may determine the amount of strain on the channel. This is called a proximity effect. Various methods can be used to make the first fin transistor 101 and the second fin transistor 201 have different stress proximities. In the semiconductor device shown in FIGS. 1-3, according to an embodiment of the present inventive concept, a first distance L1 between a first gate electrode 147 and a first source/drain 161 (e.g., first source/drain region) and a second distance L2 between a second gate electrode 247 and a second source/drain 261 (e.g., second source/drain region) are adjusted to be different from each other, such that the first stress proximity and the second stress proximity are different from each other.

It will be understood that the stress proximity effects discussed herein can also be specified relative to a position in the channel region associated with a respective source/drain region. For example, as shown in FIG. 3, the stress proximity effects can also be specified by a distance from the respective source/drain region to a center of the channel region associated with the same fin transistor 201. In particular, the first fin transistor 101 can experience a stress proximity effect that is defined by the distance between the first source/drain region 161 and a center of the channel region for the first fin transistor 101. Similarly, the second fin transistor 101 can experience a separate stress proximity effect that is defined by the distance from the second source/drain region 261 to a center of the channel region associated with the second fin transistor 201. Accordingly, the stress proximity effects for the respective fin transistors 101 and 201 can be specified by the distances L3 and L4 rather than the distances L1 and L2.

It will be further understood that the reference point for the stress proximity effects can be defined relative to the interface between the source/drain region and the channel region associated with the respective transistor. For example, as described above, the distance L1 or L3 that is shown associated with the first fin transistor 101 can be shown relative to the first source/drain region 161, which can be more particularly defined by an interface location where the first source/drain region 161 ends and the channel region associated with the first fin transistor 101 begins. It will be understood that although this reference location is defined as an interface, the actual location may actually not be a particular location, as the source/drain and channel regions may not define a clearly marked boundary but rather are subject to the device physics associated with the diffusion of impurities. It will be understood, however, that the interface location should be interpreted as being a consistent reference point applied to the different transistors.

The first fin transistor 101 may include a first fin F1, the first gate electrode 147, a first recess 125, and the first source/drain 161.

The first fin F1 may extend along a second direction Y1. The first fin F1 may be a part of a substrate 100 and may include an epitaxial layer grown from the substrate 100. An element isolation film 110 may cover lower side walls of the first fin F1 whereas upper side walls of the first fin F1 are exposed.

The first gate electrode 147 may be formed on the first fin F1 to intersect the first fin F1. The first gate electrode 147 may extend in a first direction X1.

The first gate electrode 147 may include metal layers MG1 and MG2. As shown in the drawings, the first gate electrode 147 may include a stack of two or more metal layers MG1 and MG2. A first metal layer MG1 can control a work function, and a second metal layer MG2 fills a space formed by the first metal layer MG1. The first metal layer MG1 may include at least one of, e.g., TiN, TaN, TiC and TaC. In addition, the second metal layer MG2 may include W or Al. Alternatively, the first gate electrode 147 may be made of Si, SiGe, or the like rather than a metal. The first gate electrode 147 may be formed using a replacement process, however, other processes may be used.

A first gate insulating film 145 may be formed between the first fin F1 and the first gate electrode 147. Referring to FIG. 2, the first gate insulating film 145 may be formed on top and side surfaces of the first fin F1. In addition, the first gate insulating film 145 may be disposed between the first gate electrode 147 and the element isolation film 110. The first gate insulating film 145 may include a high-k material having a higher dielectric constant than a silicon oxide film. For example, the first gate insulating film 145 may include $HfO_2$, $ZrO_2$, or $Ta_2O_5$.

The first recess 125 may be formed in the first fin F1 on both sides of the first gate electrode 147. The first recess 125 may have sloping side walls. Thus, the first recess 125 may become wider as the distance from the substrate 100 increases. As shown in FIG. 1, the first recess 125 may be wider than the first fin F1.

The first source/drain 161 is formed in the first recess 125. The first source/drain 161 may be an elevated source/drain. That is, a top surface of the source/drain 161 may be higher than an upper surface of a first interlayer insulating film 155. In addition, the first source/drain 161 and the first gate electrode 147 may be insulated from each other by a spacer 151.

When the first fin transistor 101 is a p-channel metal oxide (PMOS) transistor, the first source/drain 161 may include a compressive stress material. The compressive stress material may be a material (e.g., SiGe) having a lattice constant that is greater than that of Si. The compressive stress material may apply compressive stress to the first fin F1, thereby improving the mobility of carriers in a channel region.

On the other hand, when the first fin transistor 101 is an n-channel metal oxide semiconductor (NMOS) transistor, the first source/drain 161 may be the same material as the substrate 100 or a tensile stress material. For example, when the substrate 100 is Si, the first source/drain 161 may be Si or a material (e.g., SiC) having a lattice constant that is less than that of Si.

The spacer 151 may include at least one of a nitride film and an oxynitride film.

The substrate 100 may be made of one or more semiconductor materials selected from the group consisting of Si, Ge, SiGe, GaP, GaAs, SiC, SiGeC, InAs, and InP. The substrate 100 can also be a silicon-on-insulator (SOI) substrate.

The second fin transistor 201 may include a second fin F2, the second gate electrode 247, a second recess 225, and the second source/drain 261. The second gate electrode 247 may be formed on the second fin F2 to intersect the second fin F2, the second recess 225 may be formed in the second fin F2 on both sides of the second gate electrode 247, and the second source/drain 261 may be formed in the second recess 225. The second fin transistor 201 is overall similar to the first fin transistor 101, and thus differences from the first fin transistor 101 will mainly be described below.

In FIG. 1, the first fin F1 and the second fin F2 extend parallel to each other in the second direction Y1 and Y2. However, this illustration is merely for ease of description, and the present inventive concept is not limited thereto. For example, the first fin F1 may extend along the second direction Y1, and the second fin F2 may extend along the first direction X2.

Likewise, while the first gate electrode 147 and the second gate electrode 247 extend parallel to each other along the first direction X1 and X2 in FIG. 1, the present inventive concept is not limited thereto. For example, the first gate electrode 147 may extend along the first direction X1, and the second gate electrode 247 may extend along the second direction Y2.

The first fin transistor 101 and the second fin transistor 201 may be of the same conductivity type (e.g., a P type or an N type) sometimes referred to herein as a particular conductive type. Alternatively, the first fin transistor 101 may be of a first conductivity type (e.g., the P type), and the second fin transistor 201 may be of a second conductivity type (e.g., the N type).

The reference numeral 200 indicates a substrate, reference numeral 245 indicates a second gate insulating film, reference numeral 251 indicates a second spacer, reference numeral 255 indicates a second interlayer insulating film, reference character MG3 indicates a third metal layer, and reference character MG4 indicates a fourth metal layer.

Referring to FIG. 3, as described above, the first stress proximity effect in the first fin transistor 101 is different from the second stress proximity effect in the second fin transistor 201. Specifically, the first distance L1 between the first gate electrode 147 and the first source/drain 161 is different from the second distance L2 between the second gate electrode 247 and the second source/drain 261, Here, 'a distance between a and b' denotes a shortest distance between a and b. As shown in the drawing, the second distance L2 may be shorter than the first distance L1.

As described above the distances L3 and L4 are alternatively used to illustrate that the different stress proximity effects in the first fin transistor 101 and the second fin transistor 201 can be specified by the distance between the respective source/drain region and the center of the channel of the respective transistor, rather than specifying between the source/drain region and a particular portion of the gate electrode of the respective first or second fin transistor 101 and 201.

As further shown in FIG. 3, the distances L2/L4 are less than L1/L3 respectively in that the interface of the second source/drain region 261 and the channel region associated with second fin transistor 201 extends past an outer most lower corner of the respective second gate electrode 247 into the second channel region to define an undercut region beneath the second fin transistor 201.

Since the first recess 125 and the second recess 225 are respectively formed in the first source/drain 161 and the second source/drain 261, the first distance L1/L3 and the second distance L2/L4 can be adjusted by adjusting the positions of the first recess 125 and the second recess 225.

For example, if both of the first fin transistor 101 and the second fin transistor 201 are P-type transistors, the substrate 100 may be Si, and the first source/drain 161 and the second source/drain 261 may be SiGe. In this case, since SiGe has a greater lattice constant than Si, the first source/drain 161 may apply compressive stress to the channel region of the first fin transistor 101, and the second source/drain 261 may apply compressive stress to the channel region of the second fin transistor 201. However, since the first distance L1/L3 is longer than the second distance L2/L4, the compressive stress applied to the channel region of the first fin transistor 101 by the first source/drain 161 may be less than the compressive stress applied to the channel region of the second fin transistor 201 by the second source/drain 261. Accordingly, the first fin transistor 101 may have less current than the second fin transistor 201.

When a fin having a very small width (e.g., a width of 20 nm or less) is formed, a conventional photo process may not be used. For example, a sidewall image transfer (SIT) process in which a fin with a predetermined width is formed repeatedly may be used. In this case, it may be more difficult to adjust an effective channel width. That is, in the case of a conventional planar transistor, the amount of current can be more readily adjusted by changing the channel width using a photo process. However, in the case of a fin transistor using fins formed by the SIT process, it may be more difficult to adjust the amount of current since the channel width is fixed. That is, the amount of current can be adjusted only by changing the number of fins. For example, when one fin is used, the amount of current of a fin transistor is k. When two fins are used, the amount of current of the fin transistor is 2 k. That is, it is difficult to finely adjust the amount of current.

In the semiconductor device according to the first embodiment of the present inventive concept, however, the current of the first and second fin transistors 101 and 201 can be controlled by adjusting the first and second distances L1/L3 and L2/L4 between the first and second gate electrodes 147 and 247 (or centers of respective channel regions) and the first and second sources/drains 161 and 261.

Figure 4:
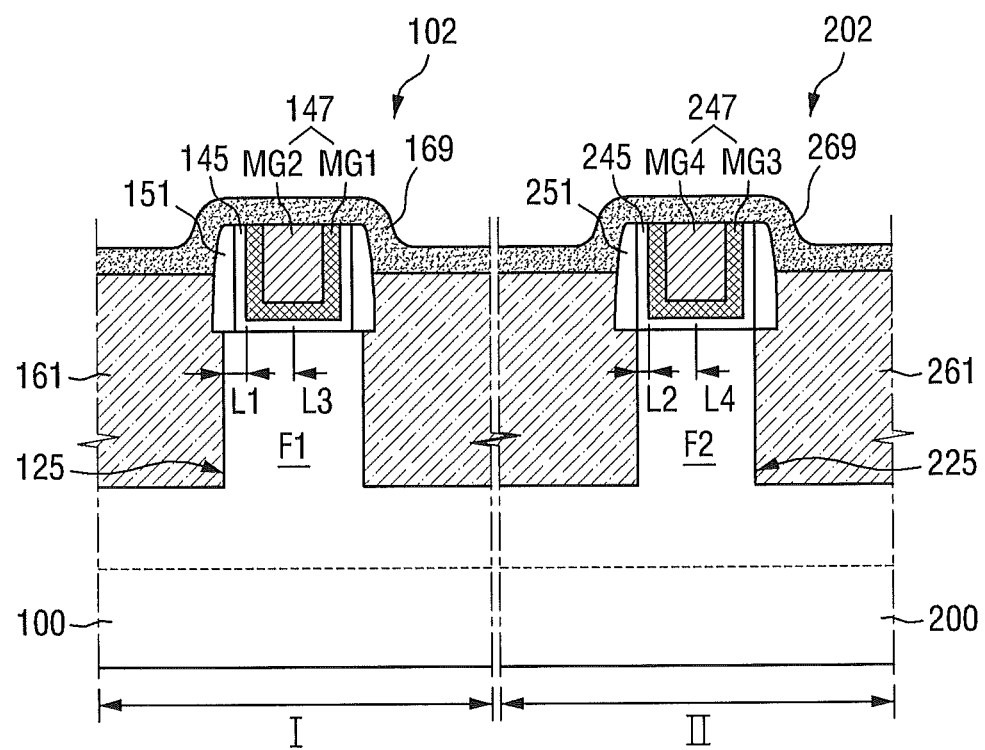
FIG. 4 is a cross-sectional view of a semiconductor device according to an embodiment of the present inventive concept.

FIG. 4 is a cross-sectional view of a semiconductor device according to a second embodiment of the present inventive concept. For simplicity, the following description will focus on differences from the semiconductor device according to the first embodiment of the present inventive concept.

Referring to FIG. 4, a first distance L1/L3 between a first gate electrode 147 (or the center of the channel region) and a first source/drain 161 in a first fin transistor 102 is different from a second distance L2/L4 between a second gate electrode 247 (or the center of the channel region) and a second source/drain 261 in a second fin transistor 202. An amount of undercut of a first recess 125 is different from an amount of undercut of a second recess 225. As shown in the drawing, the amount of undercut of the second recess 225 is greater than that of the first recess 125. Therefore, even though both source/drain regions exhibit undercut, the undercut of the second source/drain region 261 is greater.

Further, a first stress film 169 may be formed on the first fin transistor 102, and a second stress film 269 may be formed on the second fin transistor 202.

Each of the first stress film 169 and the second stress film 269 may be, for example, a SiN film. Whether the SiN film applies tensile stress or compressive stress is determined by a ratio of N—H bonding to Si—H bonding in the SiN film. For example, the SiN film may apply the tensile stress when the ratio of N—H bonding/Si—H bonding is approximately 1 to 5 and apply the compressive stress when the ratio of N—H bonding/Si—H bonding is approximately 5 to 20.

For example, if both of the first fin transistor 102 and the second fin transistor 202 are PMOS transistors, the current of the second fin transistor 202 may be greater than the current of the first fin transistor 102. The first stress film 169 and the second stress film 269 may have the effect of increasing the current of both the first fin transistor 102 and the second fin transistor 202.

Figure 5A:
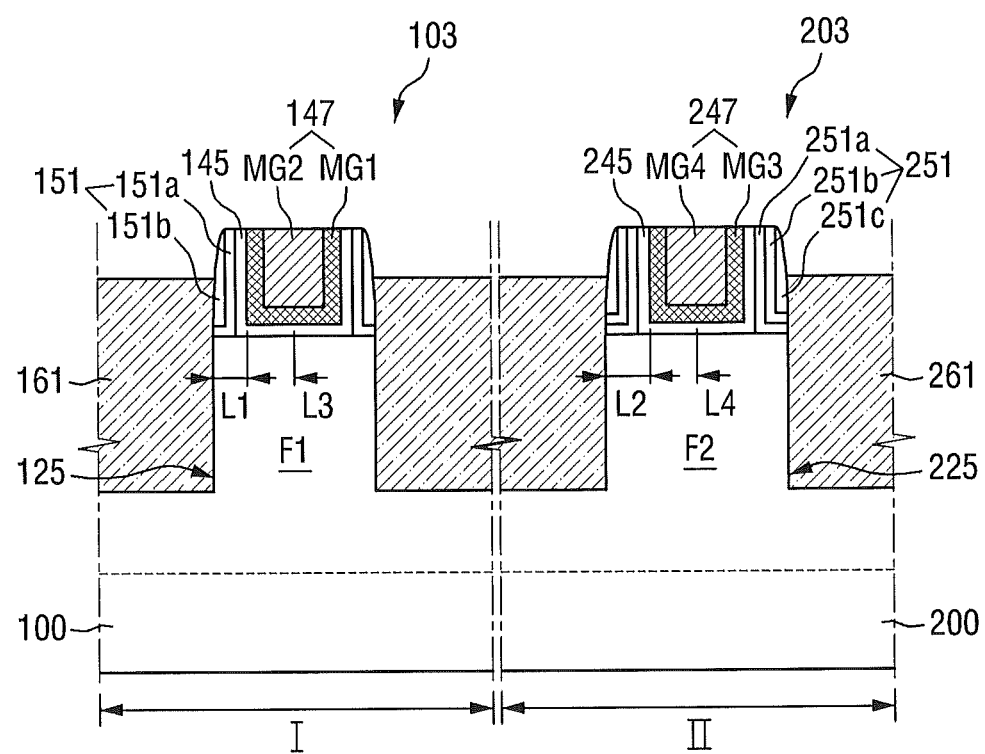
FIG. 5A is a cross-sectional view of a semiconductor device according to an embodiment of the present inventive concept.

FIG. 5A is a cross-sectional view of a semiconductor device according to an embodiment of the present inventive concept. For simplicity, the following description will focus on differences from the semiconductor device according to the first embodiment of the present inventive concept.

Referring to FIG. 5A, a first spacer 151 is disposed on sidewalls of a first gate electrode 147 of a first fin transistor 103. In addition, a second spacer 251 is disposed on sidewalls of a second gate electrode 247 of a second fin transistor 203. As shown in the drawing, a first thickness of the first spacer 151 is different from a second thickness of the second spacer 251.

To make the first spacer 151 and the second spacer 251 have different thicknesses, the first spacer 151 may include n (where n is a natural number) layers, and the second spacer 251 may include (n+m) (where m is a natural number) layers. In the drawing, the first spacer 151 includes two insulating layers 151a and 151b, and the second spacer 251 includes three insulating layers 251a, 251b and 251c.

A first recess 125 may be formed using the first spacer 151 as a mask, and a second recess 225 may be formed using the second spacer 251 as a mask. That is, the first recess 125 may be aligned with the first spacer 151, and the second recess 225 may be aligned with the second spacer 251. However, the present inventive concept is not limited thereto. The first recess 125 may include an undercut and extend to under the first spacer 151, and the second recess 225 may include an undercut and extend to under the second spacer 251 as described herein in reference to FIGS. 3 and 4.

Since the first spacer 151 and the second spacer 251 have different thicknesses, the first recess 125 and the second recess 225 may be located at different positions. As shown in the drawing, since the second spacer 251 is thicker than the first spacer 151, a second distance L2/L4 may be greater than a first distance L1/L3. In this case, if both of the first fin transistor 103 and the second fin transistor 203 are PMOS transistors, the first fin transistor 103 may have a greater amount of current than the second fin transistor 203.

Figure 5B:
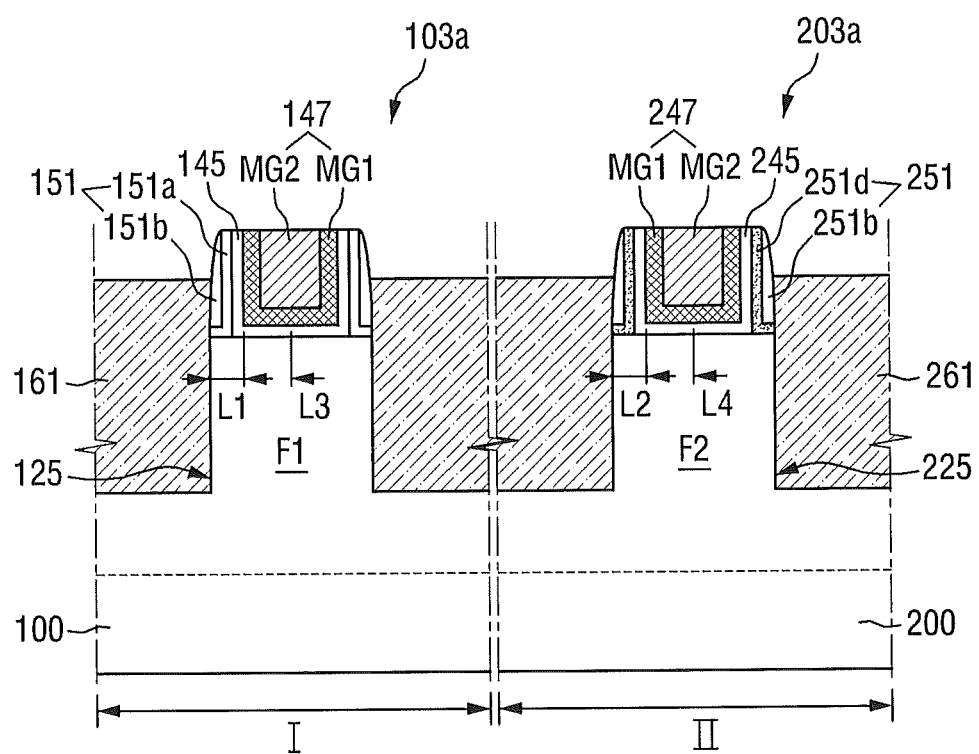
FIG. 5B is a cross-sectional view of a semiconductor device according to an embodiment of the present inventive concept.

FIG. 5B is a cross-sectional view of a semiconductor device according to an embodiment of the present inventive concept. For simplicity, the following description will focus on differences from the semiconductor device according to the first embodiment of the present inventive concept.

Referring to FIG. 5B, a distance L1/L3 between a first gate electrode 147 (or center of the channel region) and a first source/drain 161 in a first fin transistor 103a may be equal to a distance L2/L4 between a second gate electrode 247 (or center of the channel region) and a second source/drain 261 in a second fin transistor 203a.

Stress applied to a channel of the first fin transistor 103a by a first spacer 151 may be different from stress applied to a channel of the second fin transistor 203a by a second spacer 251. For example, different materials may be used to form the first spacer 151 and the second spacer 251. Specifically, insulating layers 151a and 151b of the first spacer 151 and an insulating layer 251b of the second spacer 251 may not be materials that apply stress to a channel. However, an insulating layer 251d of the second spacer 251 may be a material that applies stress to the channel of the second fin transistor 203a. As a result, an amount of current of the first fin transistor 103a may be different from an amount of current of the second fin transistor 203a.

Figure 6:
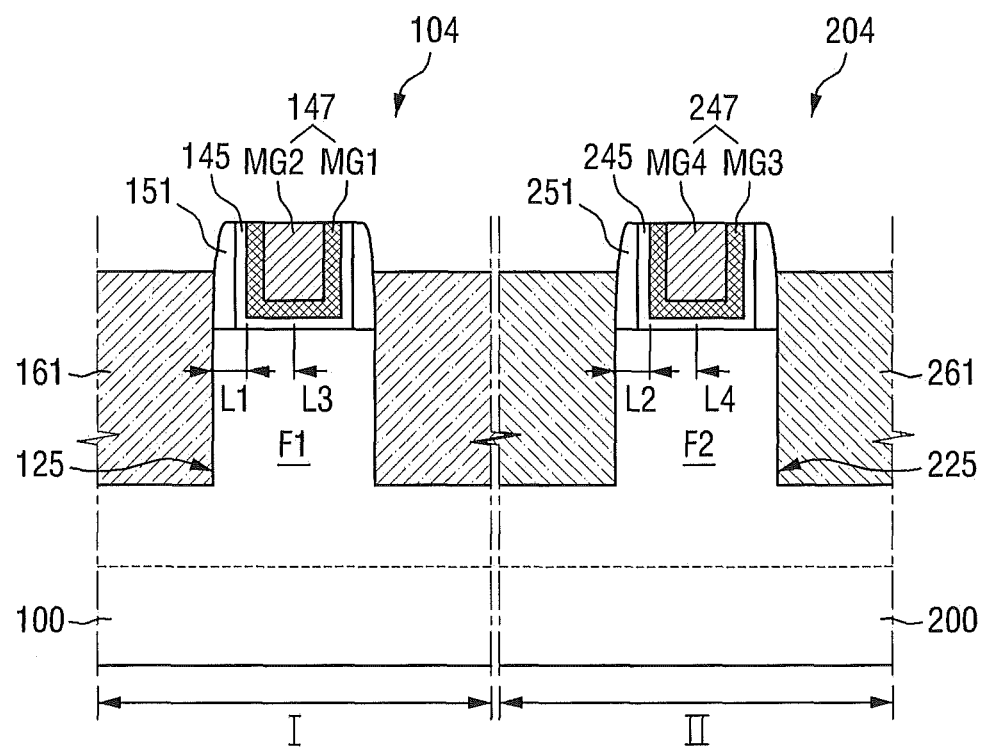
FIG. 6 is a cross-sectional view of a semiconductor device according to an embodiment of the present inventive concept.

FIG. 6 is a cross-sectional view of a semiconductor device according to an embodiment of the present inventive concept. For simplicity, the following description will focus on differences from the semiconductor device according to the first embodiment of the present inventive concept.

Referring to FIG. 6, a first distance L1/L3 associated with a first fin transistor 104 may be substantially equal to a second distance L2/L4 associated with a second fin transistor 204.

Here, the first fin transistor 104 and the second fin transistor 204 are of the same conductivity type, and an impurity concentration of a source/drain 161 formed in a first recess 125 is different from an impurity concentration of a second source/drain 261 formed in a second recess 225. For example, when the impurity concentration of the second source/drain 261 is greater than that of the first source/drain 161, a resistance of the second source/drain 261 may be less than that of the first source/drain 161. Accordingly, the second fin transistor 204 may have a greater amount of current than the first fin transistor 104. That is, the amount of current can be adjusted by controlling the impurity concentration of each of the first source/drain 161 and the second source/drain 261.

Figure 7:
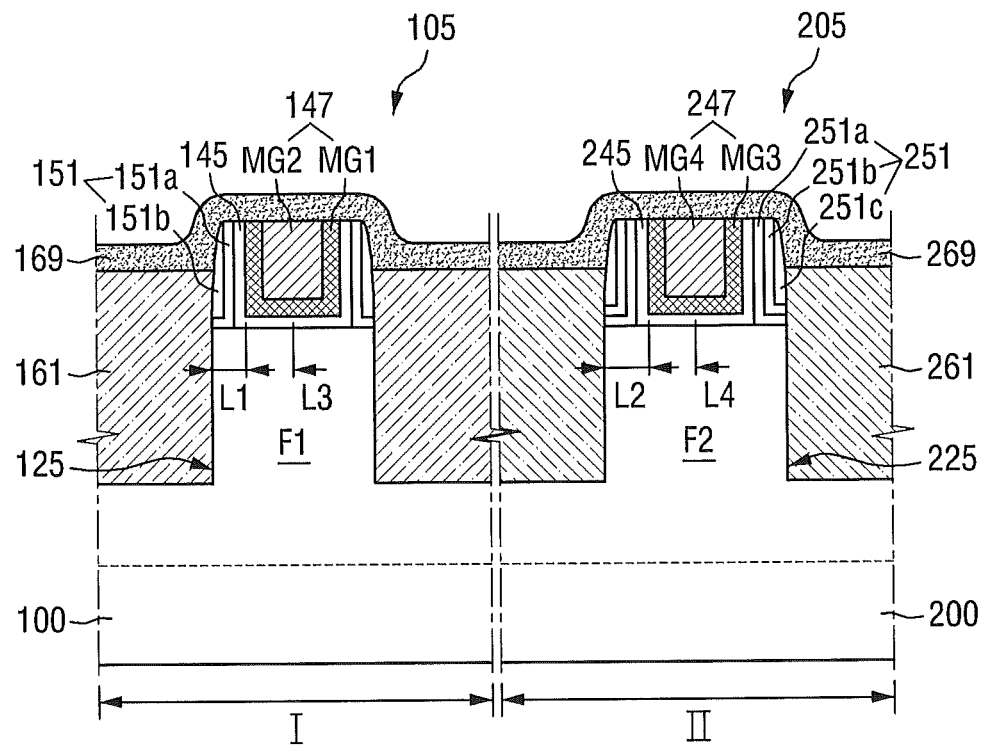
FIG. 7 is a cross-sectional view of a semiconductor device according to an embodiment of the present inventive concept.

FIG. 7 is a cross-sectional view of a semiconductor device according to an embodiment of the present inventive concept. For simplicity, the following description will focus on differences from the semiconductor device according to the first embodiment of the present inventive concept.

Referring to FIG. 7, in the semiconductor device according to an embodiment of the present inventive concept, an amount of current of a fin transistor can be adjusted using a combination of features (such as adjusting a distance between a gate electrode or a center of a channel region and a source/drain (or a source/drain channel interface), adjusting the impurity concentration, and using a stress film).

That is, a first spacer 151 is disposed on sidewalls of a first gate electrode 147 of a first fin transistor 105, and a second spacer 251 is disposed on sidewalls of a second gate electrode 247 of a second fin transistor 205. A first thickness of the first spacer 151 is different from a second thickness of the second spacer 251.

In addition, an impurity concentration of the first source/drain 161 formed in a first recess 125 is different from an impurity concentration of the second source/drain 261 formed in a second recess 225.

Further, a first stress film 169 may be formed on the first fin transistor 105, and a second stress film 269 may be formed on the second fin transistor 205.

In FIG. 7, a case where the impurity concentration of the first source/drain 161 is different from the impurity concentration of the second source/drain 261 is illustrated as an example. However, the present inventive concept is not limited to this case. For example, the concentration of a material (e.g., SiGe) that fills the first source/drain 161 may be different from the concentration of a material that fills the second source/drain 261. In this case, stress applied to a channel of the first fin transistor 105 may also be different from stress applied to a channel of the second fin transistor 205.

Figure 8:
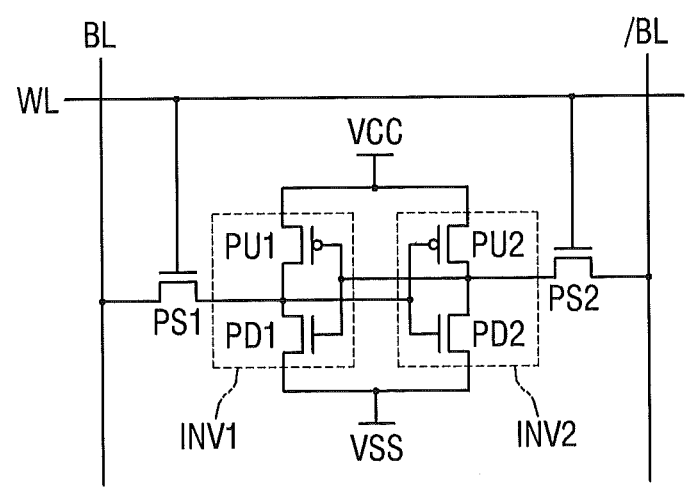
FIGS. 8 and 9 are respectively circuit and layout diagrams of a semiconductor device according to an embodiment of the present inventive concept.
Figure 9:
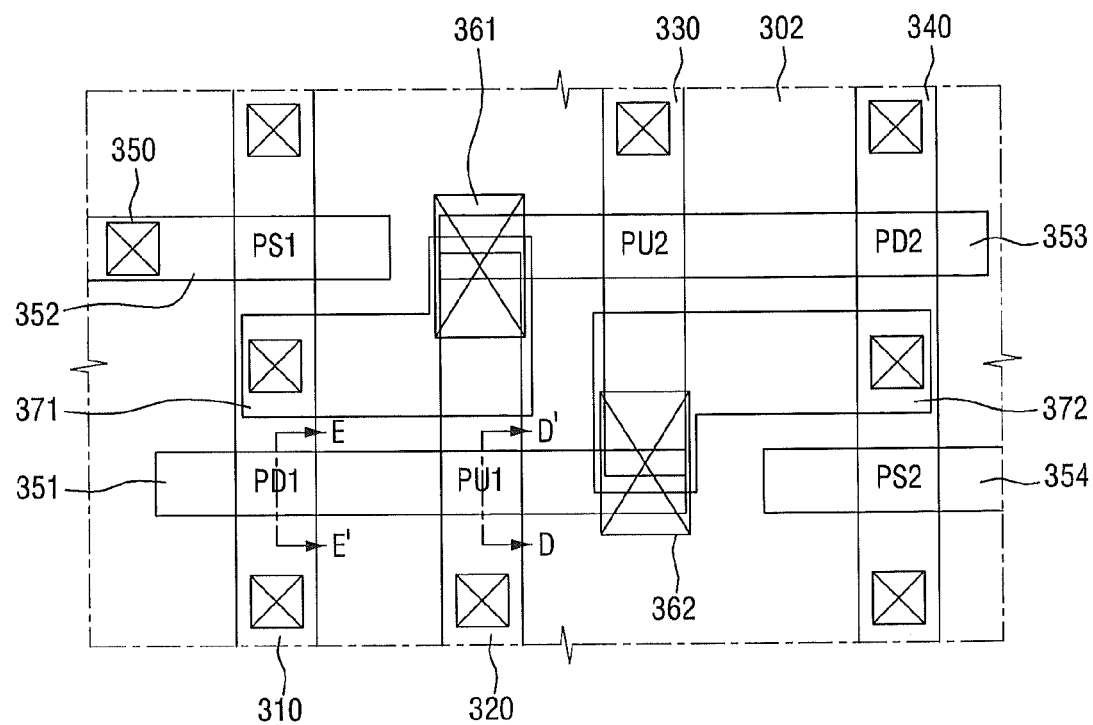
Figure 10A:
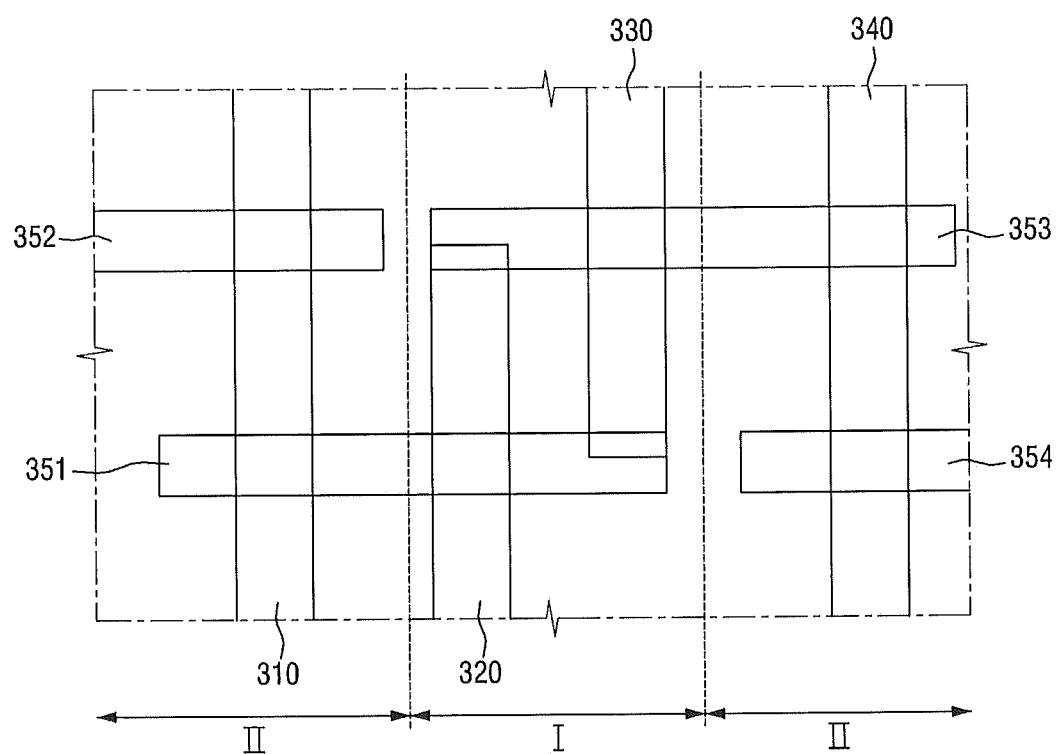
FIG. 10A shows a plurality of fins and a plurality of gate electrodes extracted from the layout diagram of FIG. 9.
Figure 10B:
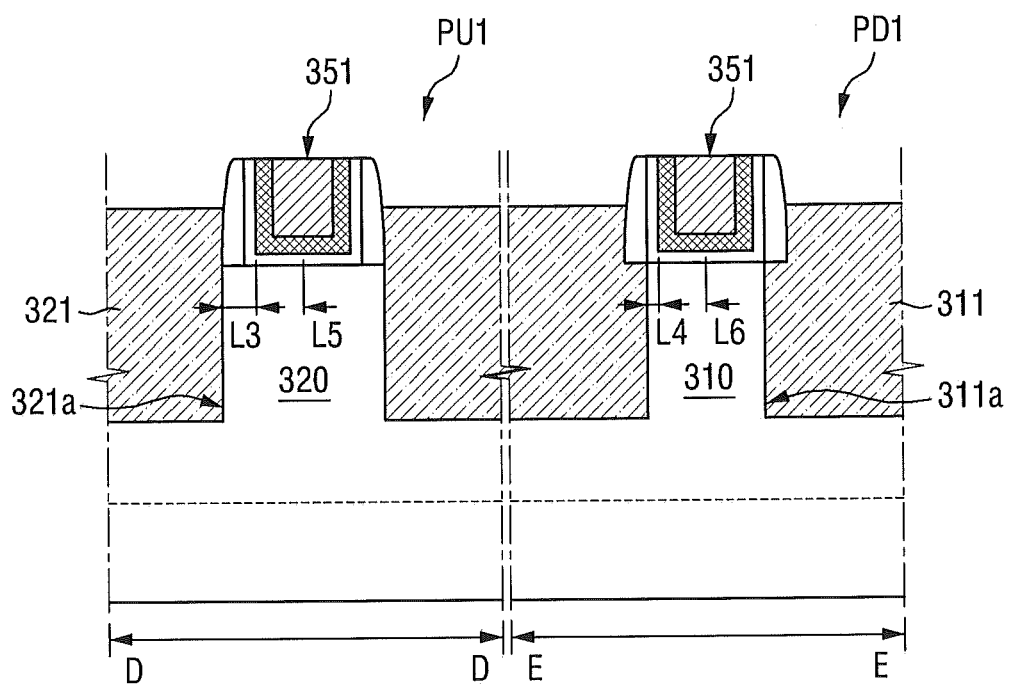
FIG. 10B is a cross-sectional view taken along the lines D-D' and E-E' of FIG. 9.

FIGS. 8 and 9 are a circuit and a layout diagram, respectively, of a semiconductor device according to an embodiment of the present inventive concept. FIG. 10A shows a plurality of fins and a plurality of gate electrodes extracted from the layout diagram of FIG. 9. FIG. 10B is a cross-sectional view taken along the lines D-D' and E-E' of FIG. 9. While the above-described semiconductor devices according to the embodiments of the present inventive concept are applicable to all structures or devices that use a fin transistor, an SRAM is illustrated as an example in FIGS. 8 through 10B.

Referring to FIG. 8, the semiconductor device according to the sixth embodiment of the present inventive concept may include a pair of inverters INV1 and INV2 connected in parallel between a power supply node Vcc and a ground node Vss and first and second pass transistors PS1 and PS2 connected respectively to output nodes of the inverters INV1 and INV2. The first pass transistor PS1 and the second pass transistor PS2 may be connected to a bit line BL and a complementary bit line BL/, respectively. A gate of the first pass transistor PS1 and a gate of the second pass transistor PS2 may be connected to a word line WL.

A first inverter INV1 includes a first pull-up transistor PU1 and a first pull-down transistor PD1 connected in series to each other, and a second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In addition, an input node of the first inverter INV1 is connected to an output node of the second inverter INV2, and an input node of the second inverter INV2 is connected to an output node of the first inverter INV1, so that the first inverter INV1 and the second inverter INV2 form one latch circuit.

Referring to FIGS. 8 through 10B, first through fourth fins 310 through 340 are separated from each other and extend in a direction (e.g., a vertical direction in FIG. 9). The second fin 320 and the third fin 330 may be shorter than the first fin 310 and the fourth fin 340.

In addition, first through fourth gate electrodes 351 through 354 extend in the other direction (e.g., a horizontal direction in FIG. 9) and intersect the first through fourth fins 310 through 340. Specifically, the first gate electrode 351 may completely intersect the first fin 310 and the second fin 320 and overlap an end of the third fin 330. The third gate electrode 353 may completely intersect the fourth fin 340 and the third fin 330 and overlap an end of the second fin 320. The second gate electrode 352 and the fourth gate electrode 354 intersect the first fin 310 and the fourth fin 340, respectively.

As shown in the drawings, the first pull-up transistor PU1 is defined in a region in which the first gate electrode 351 intersects the second fin 320, the first pull-down transistor PD1 is defined in a region in which the first gate electrode 351 intersects the first fin 310, and the first pass transistor PS1 is defined in a region in which the second gate electrode 352 intersects the first fin 310. The second pull-up transistor PU2 is defined in a region in which the third gate electrode 353 intersects the third fin 330, the second pull-down transistor PD2 is defined in a region in which the third gate electrode 353 intersects the fourth fin 340, and the second pass transistor PS2 is defined in a region in which the fourth gate electrode 354 intersects the fourth fin 340.

A recess may be formed on both sides of each of the regions in which the first through fourth gate electrodes 351 through 354 intersect the first through fourth fins 310 through 340, and a source/drain may be formed in the recess. A plurality of contacts 350 may be formed.

Furthermore, a shared contact 361 connects all of the second fin 320, a third gate electrode 353, and a wiring 371. A shared contact 362 connects all of the third fin 330, the first gate electrode 351, and a wiring 372.

The first pull-up transistor PU1, the first pull-down transistor PD1, the first pass transistor PS1, the second pull-up transistor PU2, the second pull-down transistor PD2, and the second pass transistor PS2 may all be implemented as fin transistors and may be configured as described above with reference to, for example, FIGS. 1 through 7.

For example, the above transistors may be configured as shown in FIG. 10B. The first pull-up transistor PU1 may include the second fin 320, the first gate electrode 351 which intersects the second fin 320, a first recess 321a which is formed in the second fin 320 on both sides of the first gate electrode 351, and a first source/drain 321 which is formed in the first recess 321a. The first pull-down transistor PD1 may include the first fin 310, the first gate electrode 351 which intersects the first fin 310, a second recess 311a which is formed in the first fin 310 on both sides of the first gate electrode 351, and a second source/drain 311 which is formed in the second recess 311a.

In this case, a distance L3/L5 between the first gate electrode 351 (or center of the channel region) and the first source/drain 321 of the first pull-up transistor PU1 may be different from a distance L4/L6 between the first gate electrode 351 (or center of the channel region) and the second source/drain 311 of the first pull-down transistor PD1. To reduce the consumption of current, for example, an amount of current of the first pull-up transistor PU1 may be reduced. Therefore, the distance L3/L5 may be greater than the distance L4/L6.

The first pass transistor PS1 may include the first fin 310, the second gate electrode 352 which intersects the first fin 310, a third recess which is formed in the first fin 310 on both sides of the second gate electrode 352, and a third source/drain which is formed in the third recess. As shown in the drawings, the second source/drain and the third source/drain share one node. The distance L3/L5 between the first gate electrode 351 (or center of the channel region) and the first source/drain 321 of the first pull-up transistor PU1 may be different from a distance between the second gate electrode 352 (or center of the channel region) and the third source/drain of the first pass transistor PS1. In addition, the distance L3/L5 between the first gate electrode 351 (or center of the channel region) and the first source/drain 321 of the first pull-up transistor PU1 may be longer than the distance between the second gate electrode 352 (or center of the channel region) and the third source/drain of the first pass transistor PS1.

Referring to FIG. 10A, a process of forming recesses in the first pull-up transistor PU1 and the second pull-up transistor PU2 of a first region I may be performed separately from a process of forming recesses in the first pull-down transistor PD1, the second pull-down transistor PD2, the first pass transistor PS1, and the second pass transistor PS2 of a second region II.

In so doing, the amount of current of the first pull-up transistor PU1 and the second pull-up transistor PU2 can be reduced.

Figure 11A:
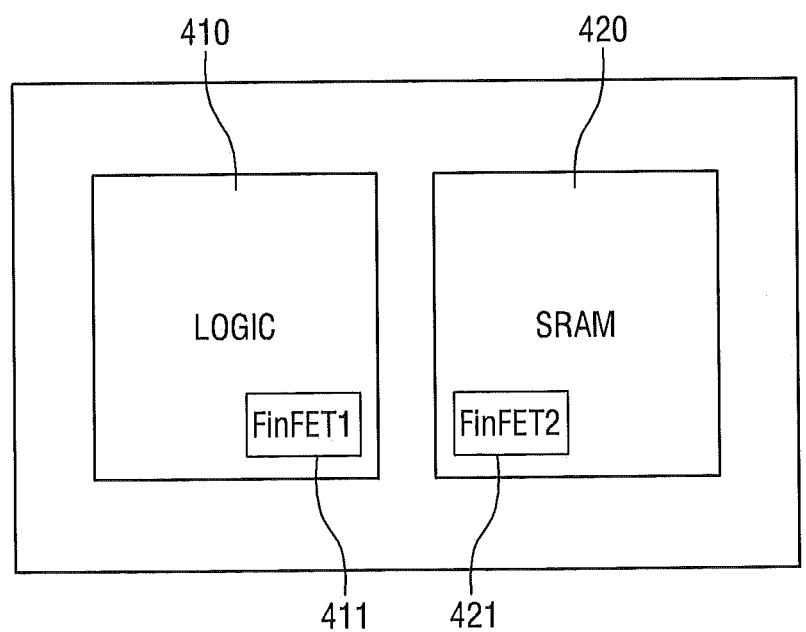
FIG. 11A is a diagram of a semiconductor device according to an embodiment of the present inventive concept.

FIG. 11A is a diagram of a semiconductor device according to an embodiment of the present inventive concept.

Referring to FIG. 11A, in the semiconductor device according to the embodiment of the present inventive concept, a fin transistor 411 may be disposed in a logic region 410, and a fin transistor 421 may be disposed in an SRAM region 420.

A distance between a gate electrode (or center of a channel region) and a source/drain of the fin transistor 411 and a distance between a gate electrode (or center of the channel region) and a source/drain of the fin transistor 421 may be adjusted to be different. Moreover, stress applied to a channel of the fin transistor 411 and stress applied to a channel of the fin transistor 421 may be adjusted to be different.

In FIG. 11A, the logic region 410 and the SRAM region 420 are illustrated as an example. However, the present inventive concept is not limited to this example. The present inventive concept is also applicable to a case where the logic region 410 and a region in which another memory (e.g., DRAM, MRAM, RRAM, PRAM, or the like) is formed are provided.

Figure 11B:
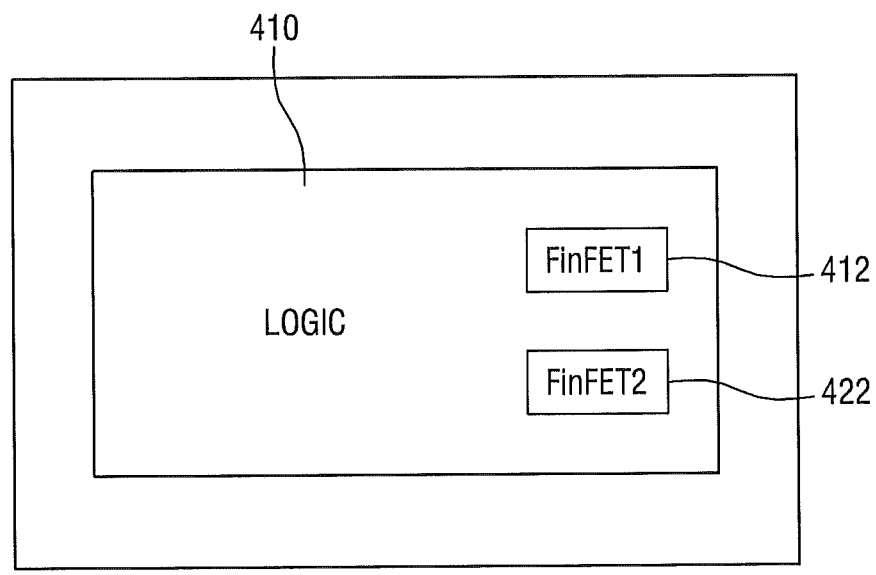
FIG. 11B is a diagram of a semiconductor device according to an embodiment of the present inventive concept.

FIG. 11B is a diagram of a semiconductor device according to an embodiment of the present inventive concept.

Referring to FIG. 11B, in the semiconductor device according to the embodiment of the present inventive concept, different fin transistors 412 and 422 may be disposed in a logic region 410.

That is, a distance between a gate electrode (or center of the channel region) and a source/drain of the fin transistor 412 and a distance between a gate electrode (or center of the channel region) and a source/drain of the fin transistor 422 may be adjusted to be different. Moreover, stress applied to a channel of the fin transistor 412 and stress applied to a channel of the fin transistor 422 may be adjusted to be different.

Figure 11C:
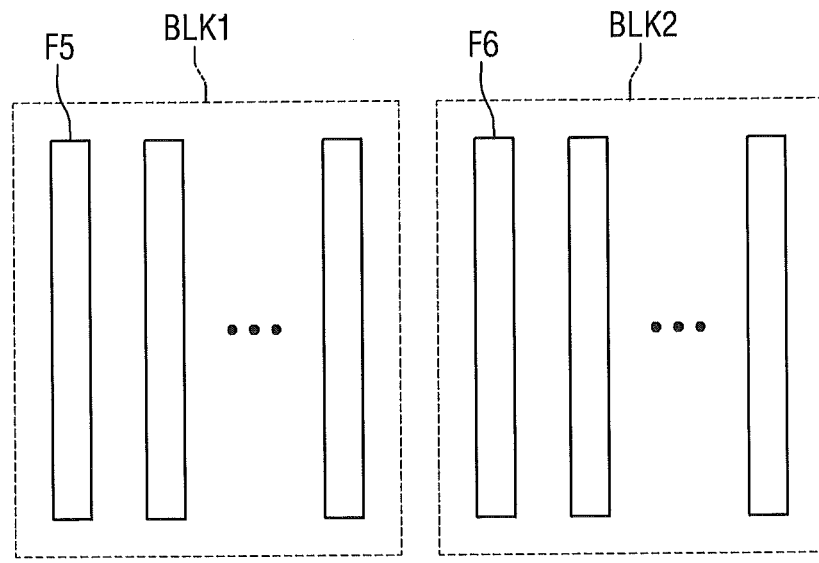
FIG. 11C is a diagram of a semiconductor device according to an embodiment of the present inventive concept.

FIG. 11C is a diagram of a semiconductor device according to an embodiment of the present inventive concept.

Referring to FIG. 11C, in the semiconductor device according to the embodiment of the present inventive concept, a plurality of blocks, e.g., BLK1 and BLK2 are defined in a substrate. Here, different fin transistors may be disposed in each of the blocks BLK1 and BLK2. As shown in the drawing, one or more fins F5 or F6 may be disposed in each of the blocks BLK1 and BLK2. A distance between a gate electrode (or center of the channel region) and a source/drain of a fin transistor disposed in the block BLK1 and a distance between a gate electrode (or center of the channel region) and a source/drain of a fin transistor disposed in the block BLK2 may be adjusted to be different. Moreover, stress applied to a channel of the fin transistor disposed in the block BLK1 and stress applied to a channel of the fin transistor disposed in the block BLK2 may be adjusted to be different.

Figure 12:
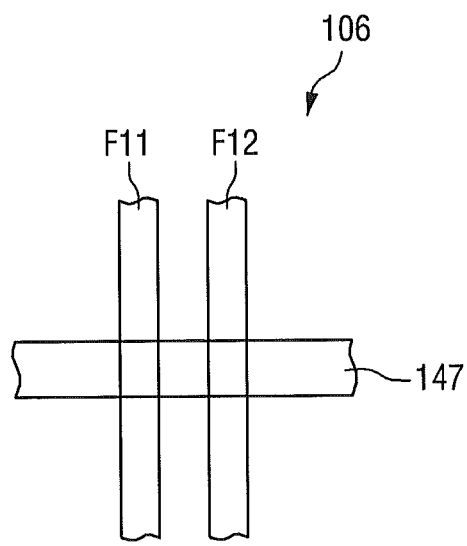
FIG. 12 is a diagram of a semiconductor device according to an embodiment of the present inventive concept.
Figure 12:
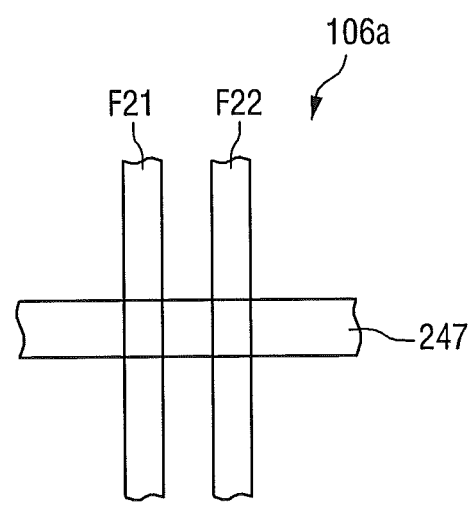

FIG. 12 is a diagram of a semiconductor device according to an embodiment of the present inventive concept. For simplicity, the following description will focus on differences from the semiconductor device according to the first embodiment of the present inventive concept.

Referring to FIG. 12, in the semiconductor device according to the embodiment of the present inventive concept, an amount of current of a fin transistor 106 or 106a is adjusted by controlling the number of fins F11 and F12 or F21 and F22 used.

The fin transistor 106 includes a plurality of first fins F11 and F12 which are separated from each other and parallel to each other. A first gate electrode 147 may intersect the first fins F11 and F12. The fin transistor 106a includes a plurality of second fins F21 and F22 which are separated from each other and parallel to each other. A second gate electrode 247 may intersect the second fins F21 and F22.

A distance between the first gate electrode 147 (or center of the channel region) and a source/drain of the fin transistor 106 may be different from a distance between the second gate electrode 247 (or center of the channel region) and a source/drain of the fin transistor 106a. Additionally or alternatively, an impurity concentration of the source/drain of the fin transistor 106 may be different from an impurity concentration of the source/drain of the fin transistor 106a.

When the number of fins F11 and F12 used by the fin transistor 106 increases, the amount of current may increase. That is, if the amount of current of the fin transistor 106 is j when one fin is used, it becomes 2j when two fins F11 and F12 are used. In addition, as described above, the amount of current of the fin transistor 106a may be adjusted to be a little different from the amount of current of the fin transistor 106. For example, the amount of current of the fin transistor 106a may be approximately 2j+α or 2j−α.

Therefore, according to the embodiment of the present inventive concept, fin transistors 106 and 106a having various amounts of current can be implemented.

Figure 13:
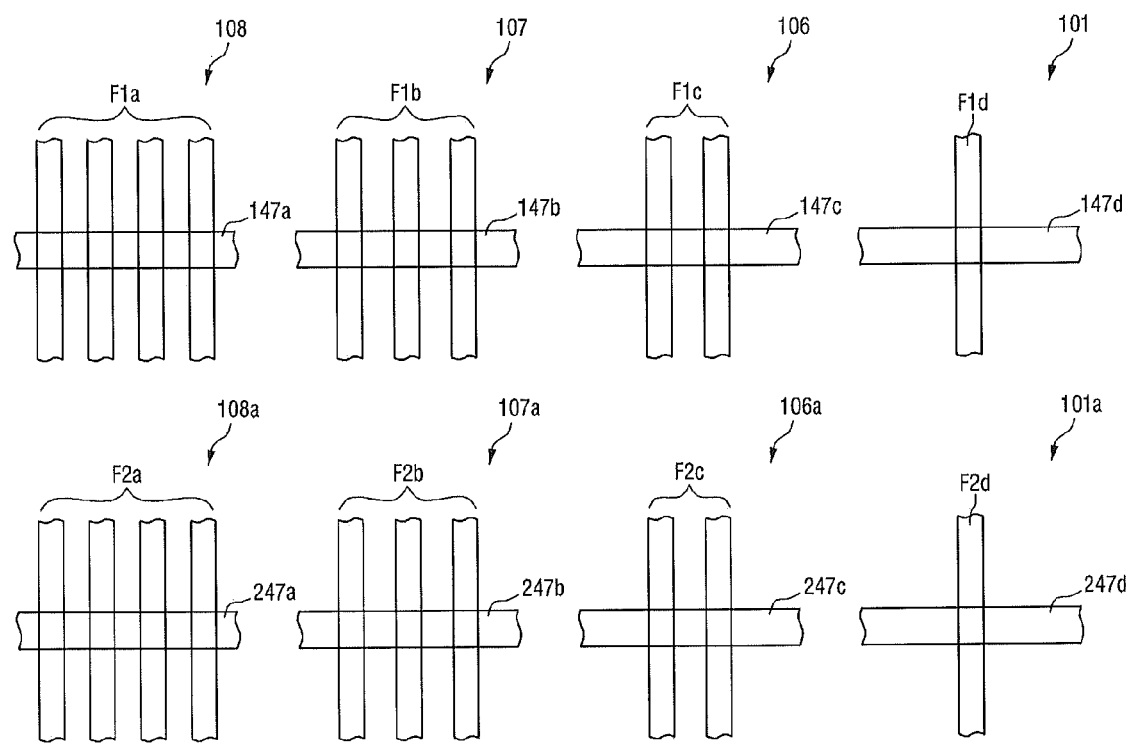
FIG. 13 is a diagram of a semiconductor device according to an embodiment of the present inventive concept.

FIG. 13 is a diagram of a semiconductor device according to an embodiment of the present inventive concept. For simplicity, the following description will focus on differences from the semiconductor device according to the eighth embodiment of the present inventive concept.

Referring to FIG. 13, in the semiconductor device according to the embodiment of the present inventive concept, amounts of current of fin transistors 108, 107, 106 and 101 can be adjusted by controlling the number of fins F1a, F1b, F2a, F2b, F3a, F3b, F4a, and F4b used.

Fin transistors 108 and 108a each use four fins F1a or F2a. If an amount of current of a fin transistor is j when one fin is used, the amount of current of the fin transistor 108 using four fins F1a is 4j. In addition, the amount of current of the fin transistor 108a may be approximately 4j+α or 4j−α.

Fin transistors 107 and 107a each use three fins F1b or F2b. The amount of current of the fin transistor 107 using three fins F1b is 3j. In addition, the amount of current of the fin transistor 107a may be approximately 3j+α or 3j−α.

Fin transistors 106 and 106a each use two fins F1c or F2c. The amount of current of the fin transistor 106 using two fins F1c is 2j. In addition, the amount of current of the fin transistor 106a may be approximately 2j+α or 2j−α.

Fin transistors 101 and 101a each use one fin F1d or F2d. The amount of current of the fin transistor 101 using one fin F1d is j. In addition, the amount of current of the fin transistor 101a may be approximately j+α or j−α.

Therefore, according to the embodiment of the present inventive concept, fin transistors 108, 108a, 107, 107a, 106, 106a, 101 and 101a having various amounts of current can be implemented.

FIGS. 14 through 26 are diagrams illustrating intermediate structures provided in methods of fabricating semiconductor devices according to embodiments of the present inventive concept. In FIGS. 14 through 20, only a first fin transistor 101 (see FIG. 1) is illustrated, as fabricating the first fin transistor 101 is substantially the same as fabricating a second fin transistor 201 (see FIG. 1). In FIGS. 21 through 26, the first fin transistor 101 and the second fin transistor 201 are illustrated. FIGS. 22 and 25 are cross-sectional views taken along the line A-A' of FIGS. 21 and 24, respectively. FIGS. 23 and 26 are cross-sectional views taken along the lines B-B' and C-C' of FIG. 24, respectively.

Figure 14:
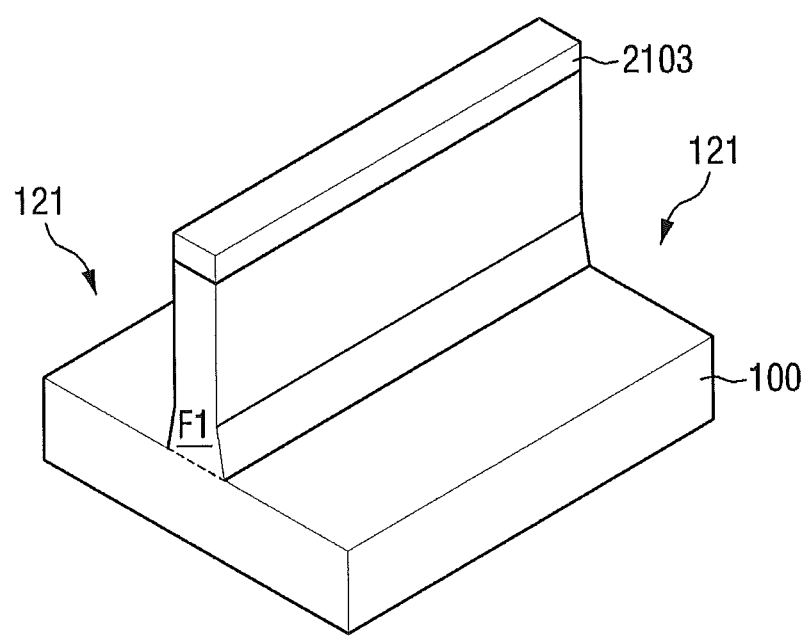
FIGS. 14 through 26 are diagrams illustrating intermediate structures provided as portions of a method of fabricating the semiconductor device according to an embodiment of the present inventive concept.

Referring to FIG. 14, a first fin F1 is formed in a first region I. Specifically, a mask pattern 2103 is formed on a substrate 100, and then an etching process is performed to form the first fin F1. The first fin F1 may extend along a second direction Y1. A trench 121 is formed around the first fin F1. The mask pattern 2103 may be made of a material that includes at least one of a silicon oxide film, a silicon nitride film, and a silicon oxynitride film.

Figure 15:
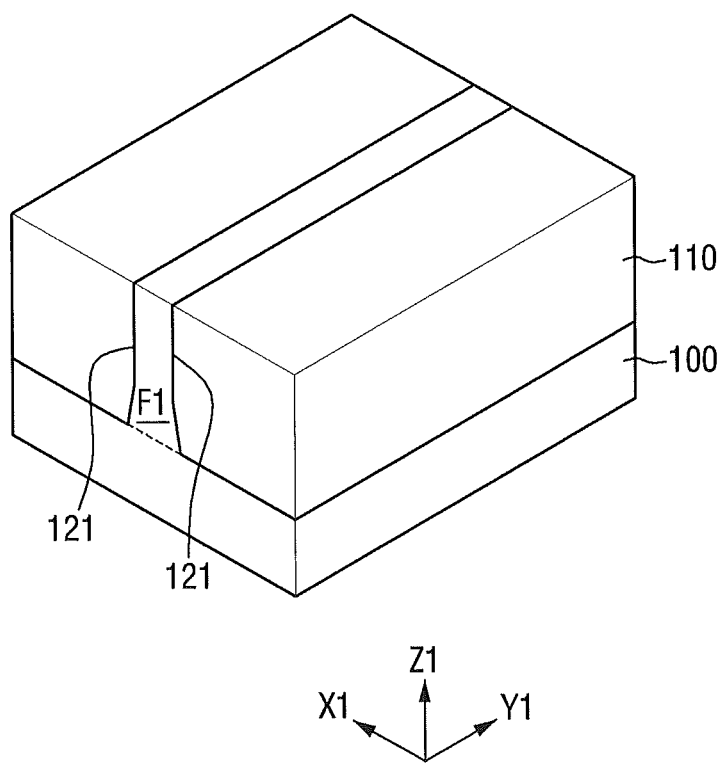

Referring to FIG. 15, an element isolation film 110 is formed to fill the trench 121. The element isolation film 110 may be made of a material that includes at least one of a silicon oxide film, a silicon nitride film, and a silicon oxynitride film.

Figure 16:
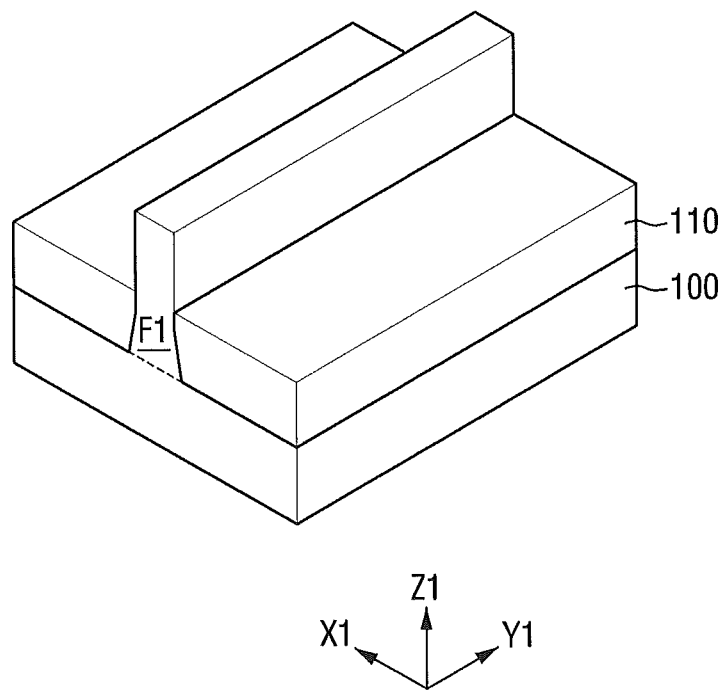

Referring to FIG. 16, an upper part of the element isolation film 110 is recessed to expose an upper part of the first fin F1 including upper sidewalls thereof. The recess process may include a selective etching process. The mask pattern 2103 may be removed before or after the formation of the element isolation film 110.

A part of the first fin F1 which protrudes upward from the element isolation film 110 may be formed by an epitaxial process. Specifically, after the element isolation film 110 is formed, an epitaxial process may be performed using a top surface of the first fin F1, which is exposed by the element isolation film 110, as a seed. As a result, the protruding part of the first fin F1 (including the upper side walls) may be formed without a recess process.

In addition, a doping process for controlling a threshold voltage may be performed on the first fin F1. When the first fin transistor 101 is an NMOS transistor, impurities may be B. When the first fin transistor 101 is a PMOS transistor, the impurities may be P or As.

Figure 17:
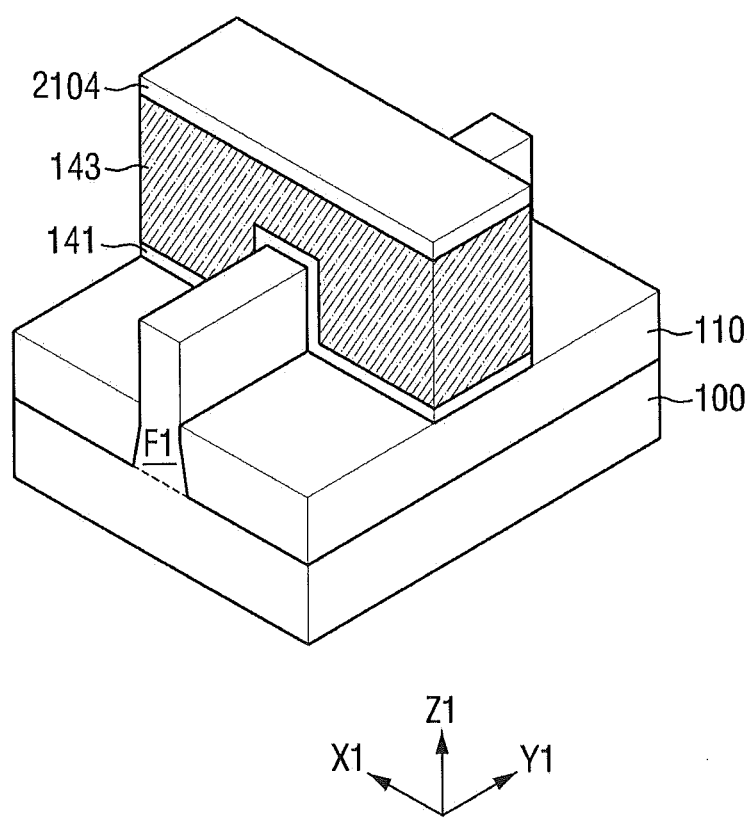

Referring to FIG. 17, an etching process is performed using a mask pattern 2104, thereby forming a dummy gate insulating film 141 and a first dummy gate electrode 143 which intersect the first fin F1 and extend in a first direction X1.

For example, the dummy gate insulating film 141 may be a silicon oxide film, and the first dummy gate electrode 143 may be polysilicon.

Figure 18:
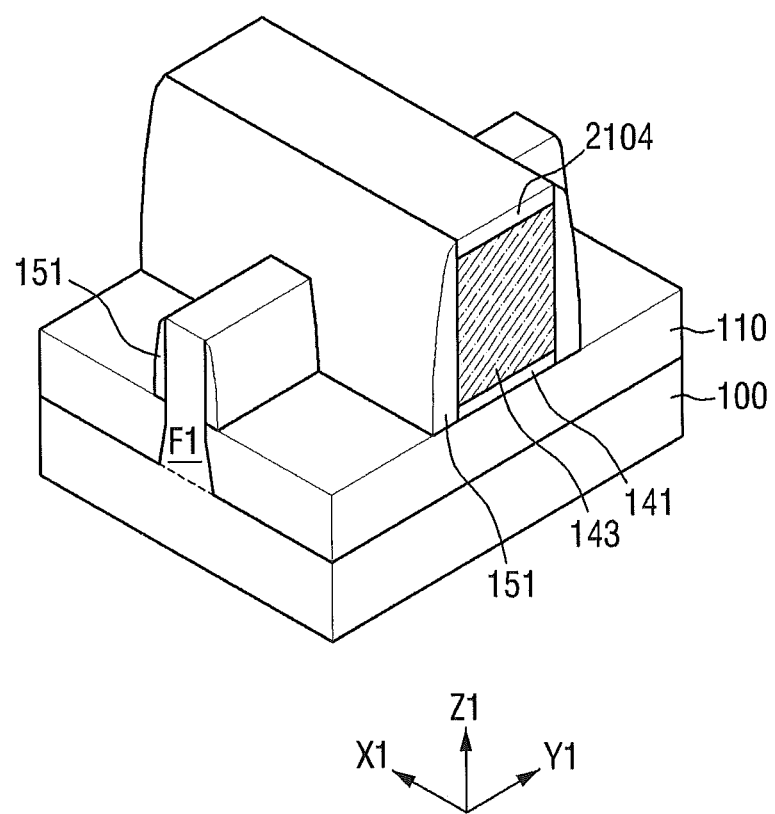

Referring to FIG. 18, a first spacer 151 is formed on side walls of the first dummy gate electrode 143 and upper side walls of the first fin F1.

For example, an insulating layer may be formed on the resultant structure (of FIG. 17) having the first dummy gate electrode 143, and then an etch-back process may be performed, thereby forming the first spacer 151. The first spacer 151 may expose a top surface of the mask pattern 2104 and the top surface of the first fin F1. The first spacer 151 may be a silicon nitride film or a silicon oxynitride film.

Figure 19:
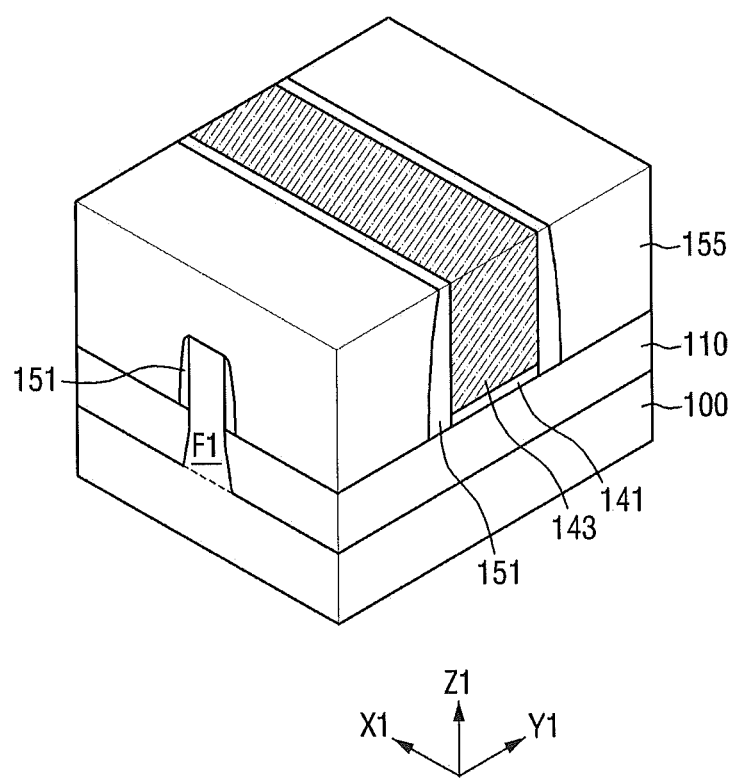

Referring to FIG. 19, an interlayer insulating film 155 is formed on the resultant structure (of FIG. 18) having the first spacer 151. The interlayer insulating film 155 may be a silicon oxide film.

Next, the interlayer insulating film 155 is planarized until a top surface of the first dummy gate electrode 143 is exposed. As a result, the mask pattern 2104 is removed, thereby exposing the top surface of the first dummy gate electrode 143.

Figure 20:
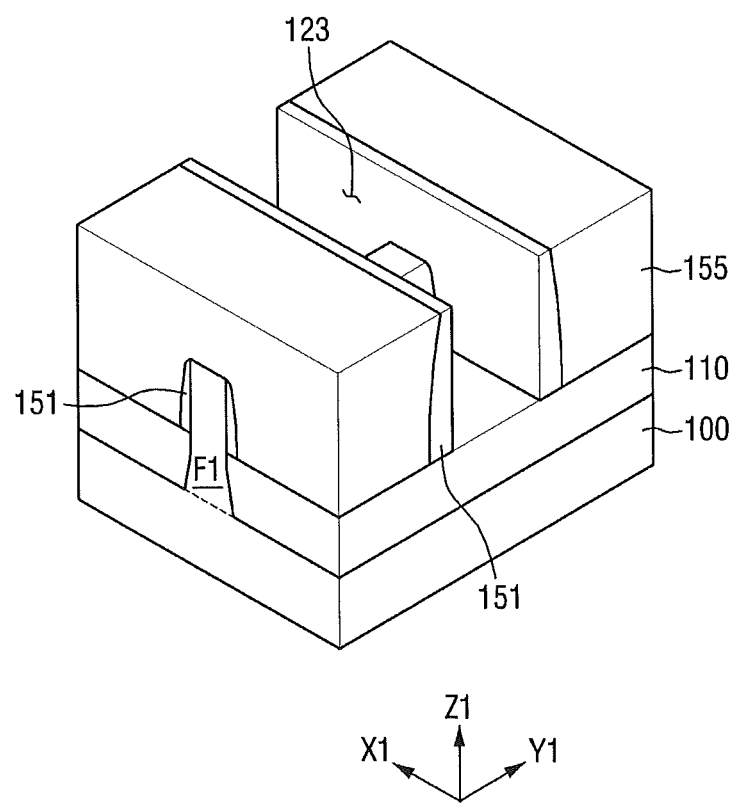

Referring to FIG. 20, the dummy gate insulating film 141 and the first dummy gate electrode 143 are removed. The removal of the dummy gate insulating film 141 and the first dummy gate electrode 143 results in the formation of a trench 123 which exposes the element isolation film 110.

Figure 21:
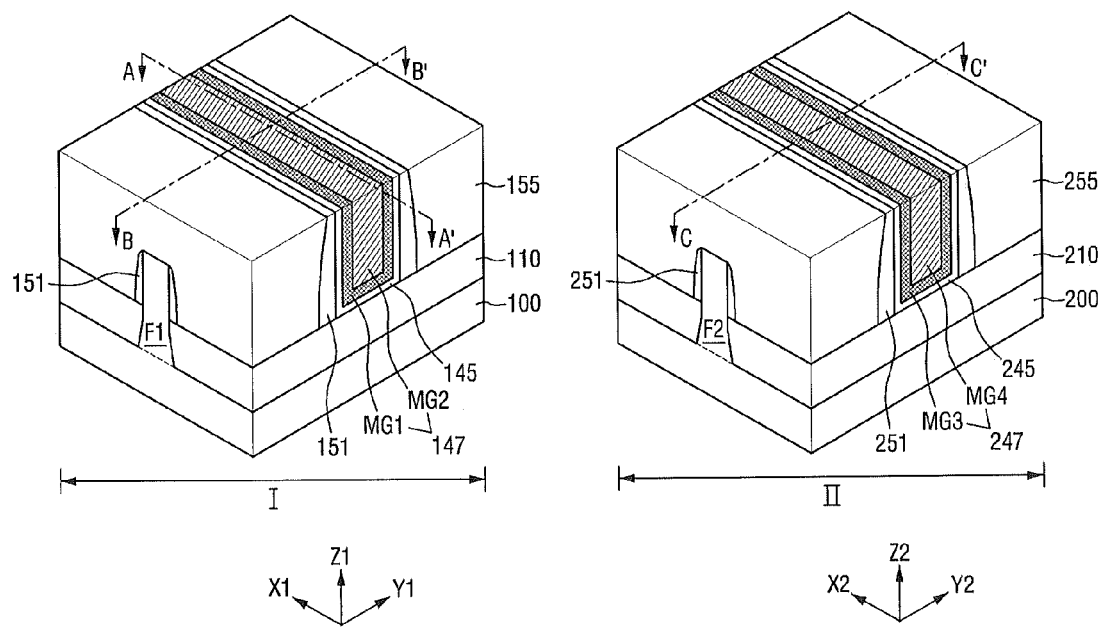
Figure 22:
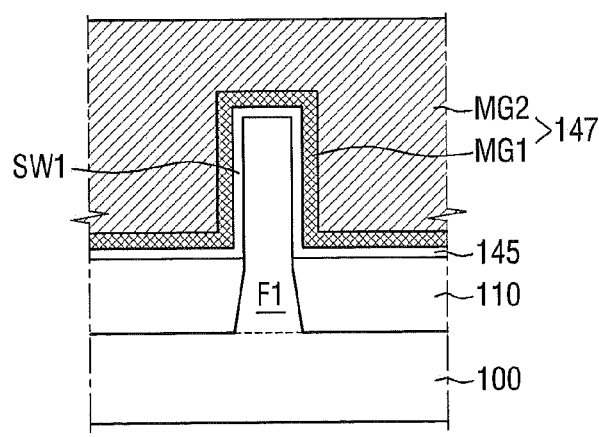
Figure 23:
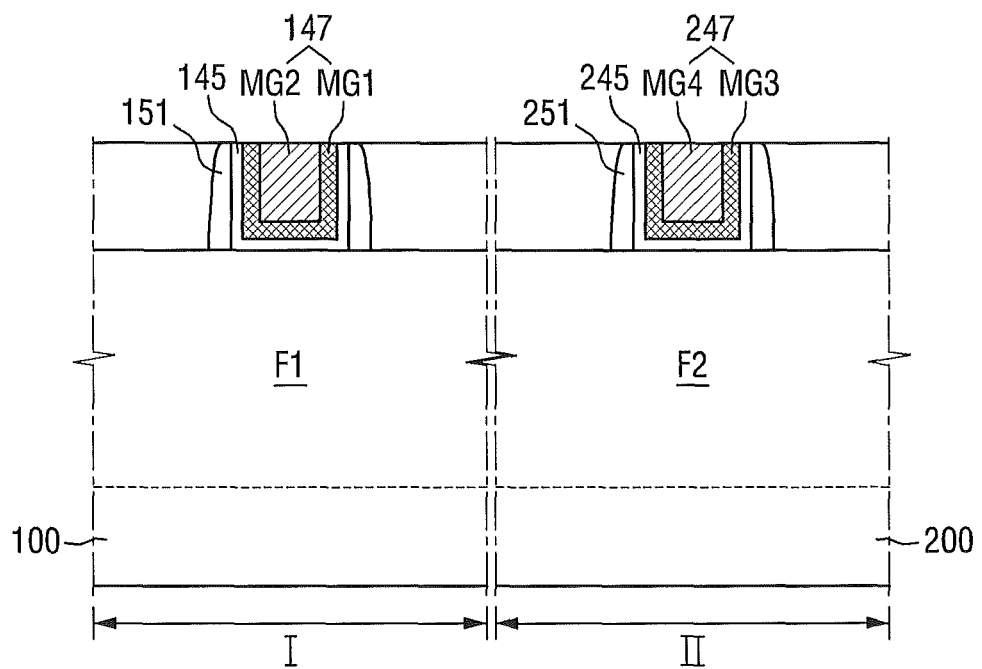

Referring to FIGS. 21 through 23, a first gate insulating film 145 and a first gate electrode 147 are formed in the trench 123.

The first gate insulating film 145 may include a high-k material having a higher dielectric constant than a silicon oxide film. The first gate insulating film 145 may include, for example, $HfO_2$, $ZrO_2$, or $Ta_2O_5$. The first gate insulating film 145 may be substantially conformally formed along sidewalls and a bottom surface of the trench 123.

The first gate electrode 147 may include metal layers MG1 and MG2. As shown in the drawings, the first gate electrode 147 may include a stack of two or more metal layers MG1 and MG2. A first metal layer MG1 controls a work function, and a second metal layer MG2 fills a space formed by the first metal layer MG1. The first metal layer MG1 may include at least one of e.g., TiN, TaN, TiC and TaC. In addition, the second metal layer MG2 may include W or Al. Alternatively, the first gate electrode 147 may be made not of metal but of Si, SiGe, or the like.

In the same way as described above, a second gate insulating film 245 and a second gate electrode 247 are formed in a second region II. The second gate electrode 247 may include metal layers MG3 and MG4.

Figure 24:
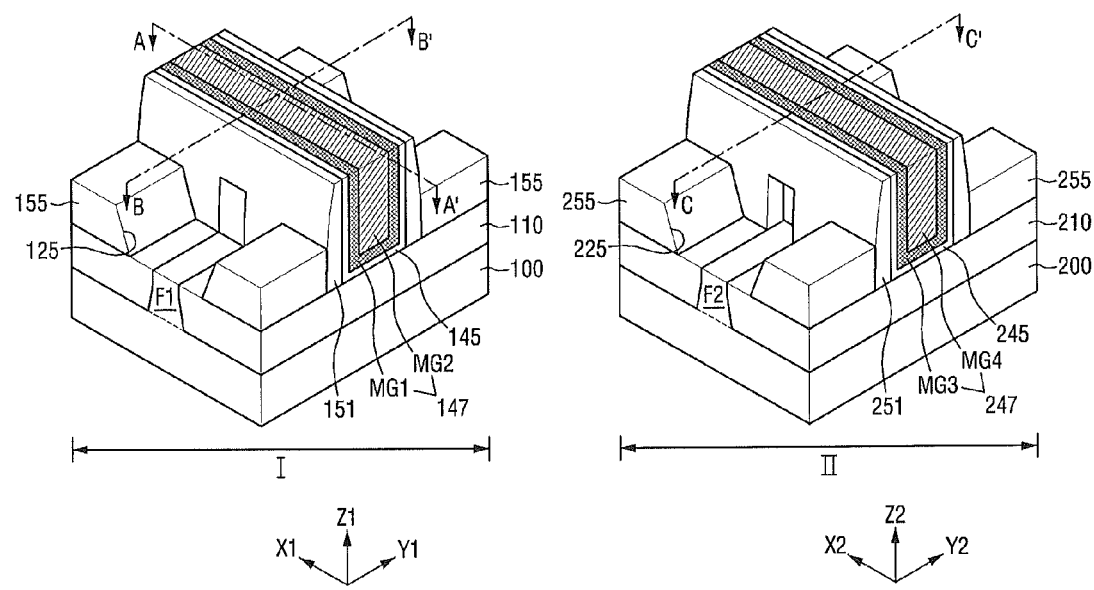
Figure 25:
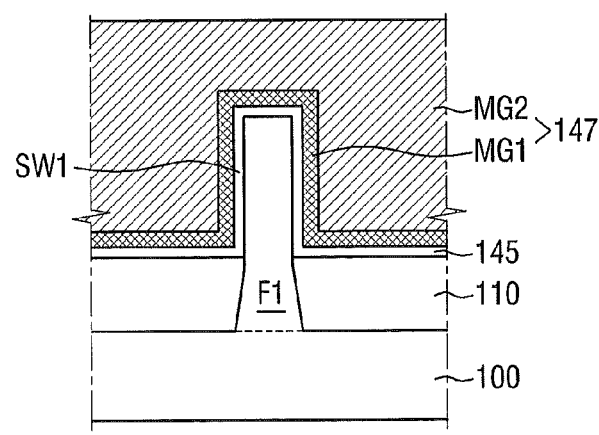
Figure 26:
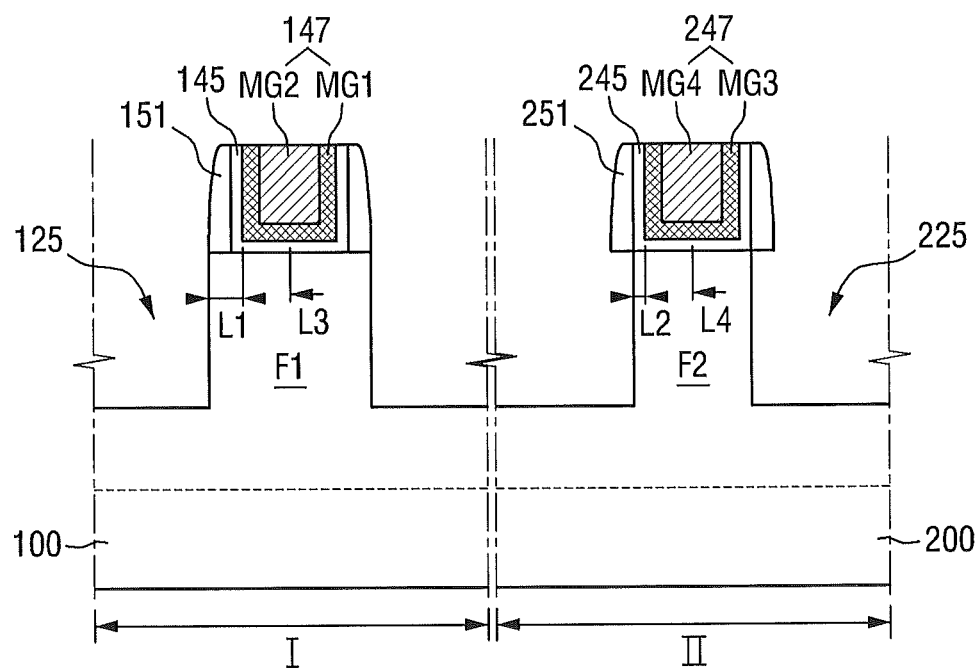

Referring to FIGS. 24 through 26, a first recess 125 is formed in the first fin F1 on both sides of the first gate electrode 147 in the first region I, and a second recess 225 is formed in a second fin F2 on both sides of the second gate electrode 247 in the second region II.

Here, the first recess 125 and the second recess 225 may be formed such that a first distance L1/L3 between the first gate electrode 147 (or center of the channel region) and the first recess 125 is different from a second distance L2/L4 between the second gate electrode 247 (or center of the channel region) and the second recess 225. The forming of the first recess 125 may be performed separately from the forming of the second recess 225.

For example, a first wet-etching process may be performed for a first period of time using a first mask which exposes the first region I but does not expose the second region II. Then, a second wet-etching process may be performed for a second period of time which is different from the first period of time using a second mask which exposes the second region II but does not expose the first region I.

Additionally or alternatively, an etchant used to form the first recess 125 may be different from an etchant used to form the second recess 225.

For example, the first recess 125 may not include an undercut, and the second recess 225 may include an undercut. Alternatively, an amount of undercut of the first recess 125 and an amount of undercut of the second recess 225 may be adjusted to be different. Accordingly, the first distance L1/L3 and the second distance L2/L4 may become different.

Referring to FIGS. 1 through 3, a first source/drain 161 is formed in the first recess 125, and a second source/drain 261 is formed in the second recess 225. The first source/drain 161 may be, for example, an elevated source/drain. That is, a top surface of the first source/drain 161 may be higher than a bottom surface of the first interlayer insulating film 155.

The forming of the first source/drain 161 and the forming of the second source/drain 261 may be achieved by an epitaxial process. In addition, the material that forms the first source/drain 161 and the second source/drain 261 may vary according to whether the first fin transistor 101 and the second fin transistor 201 are PMOS transistors or NMOS transistors.

Impurities may be doped in situ during the epitaxial process.

FIGS. 27 through 30 are diagrams illustrating intermediate structures provided in methods of fabricating semiconductor devices according to the embodiments of the present inventive concept. For simplicity, the following description will focus on differences from the fabrication method described above with reference to FIGS. 14 through 26. The methods of fabricating the semiconductor device according to the embodiment of the present inventive concept is substantially the same as the methods of fabricating the semiconductor devices according to the first embodiment of the present inventive concept, except forming a spacer (that is, a process of FIG. 18).

Figure 27:
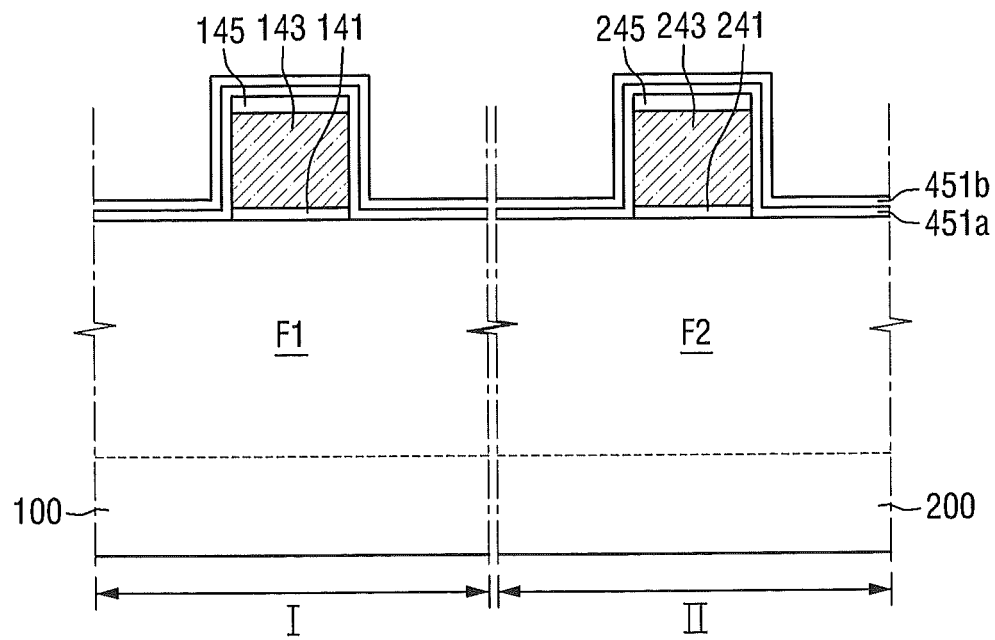
FIGS. 27 through 30 are diagrams illustrating intermediate structures provided as portions of a method of fabricating the semiconductor device according to an embodiment of the present inventive concept.

Referring to FIG. 27, n (where n is a natural number) insulating layers 451a and 451b are formed on a first region I and a second region II. In the drawing, a case where n is two is illustrated. However, the present inventive concept is not limited to this case.

Figure 28:
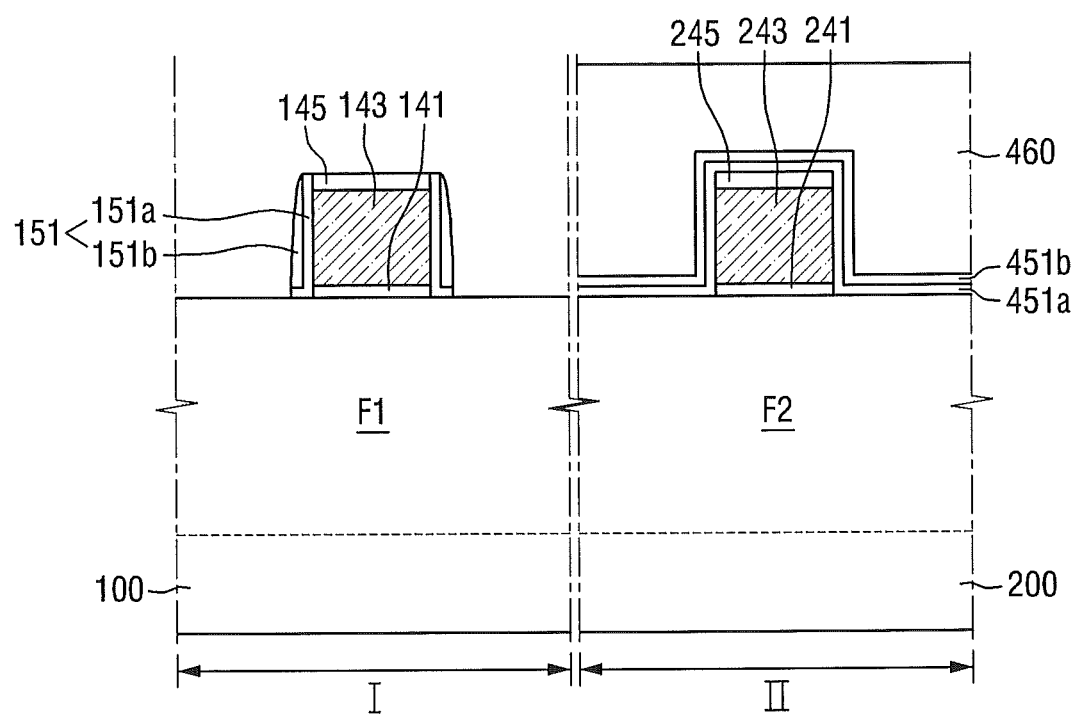

Referring to FIG. 28, the two insulating layers 451a and 451b are etched back using a first mask 460 which exposes the first region I but does not expose the second region II. As a result, a first spacer 151 is formed on sidewalls of a first dummy gate electrode 143. Then, the first mask 460 is removed.

Figure 29:
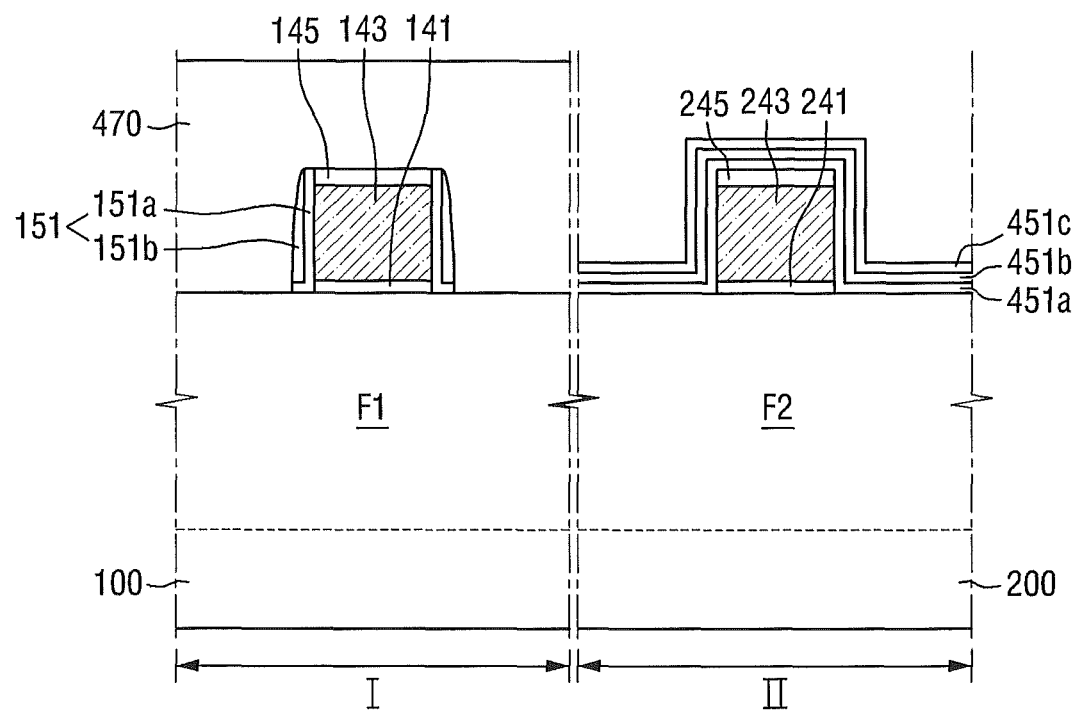

Referring to FIG. 29, a second mask 470 which exposes the second region II but does not expose the first region I is formed. Then, m (where, m is a natural number) insulating layers 451c are formed on the second region II. In the drawing, a case where m is one is illustrated as an example. However, the present inventive concept is not limited to this case.

Figure 30:
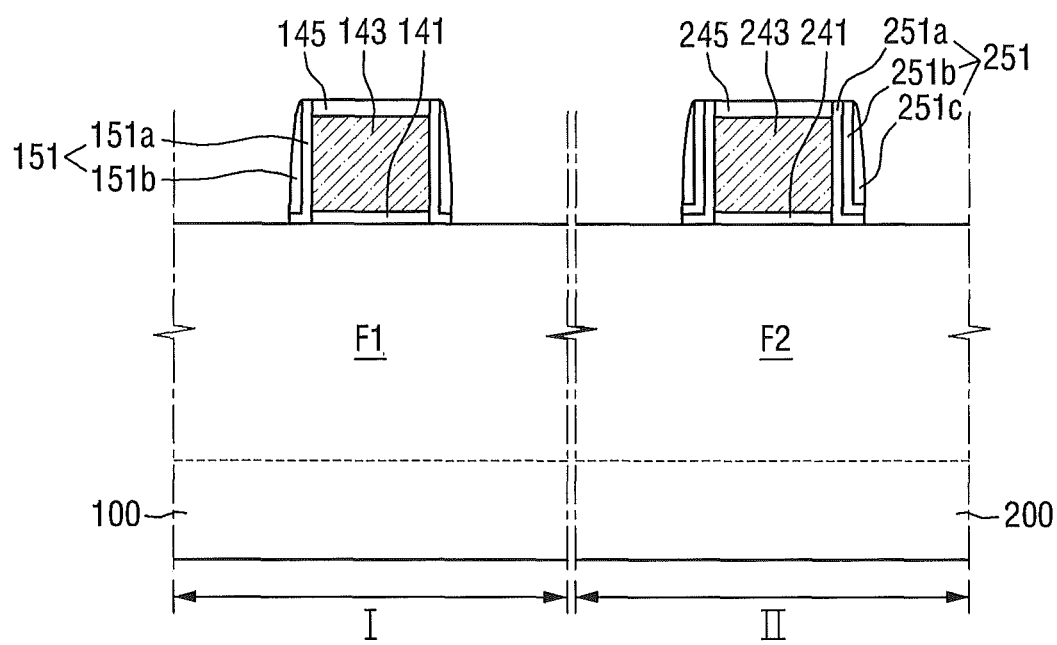

Referring to FIG. 30, the insulating layers 451a, 451b and 451c are etched back using the second mask 470. As a result, a second spacer 251 is formed on sidewalls of a second dummy gate electrode 243.

In summary, to make the first spacer 151 of the first region I and the second spacer 251 of the second region II have different thicknesses, the first spacer 151 is formed by etching back n insulating layers 451a and 451b formed on the first region I. Then, the second spacer 251 is formed by etching back (n+m) insulating layers 451a, 451b and 451c formed on the second region II.

Figure 31:
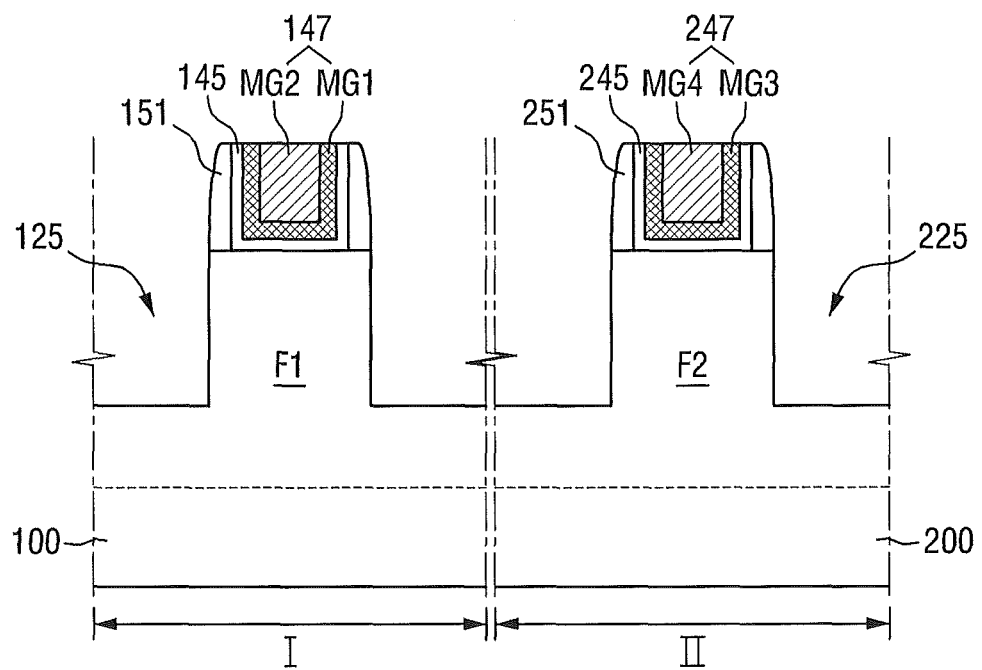
FIGS. 31 and 32 are diagrams illustrating intermediate structures provided as portions of a method of fabricating the semiconductor device according to an embodiment of the present inventive concept.
Figure 32:
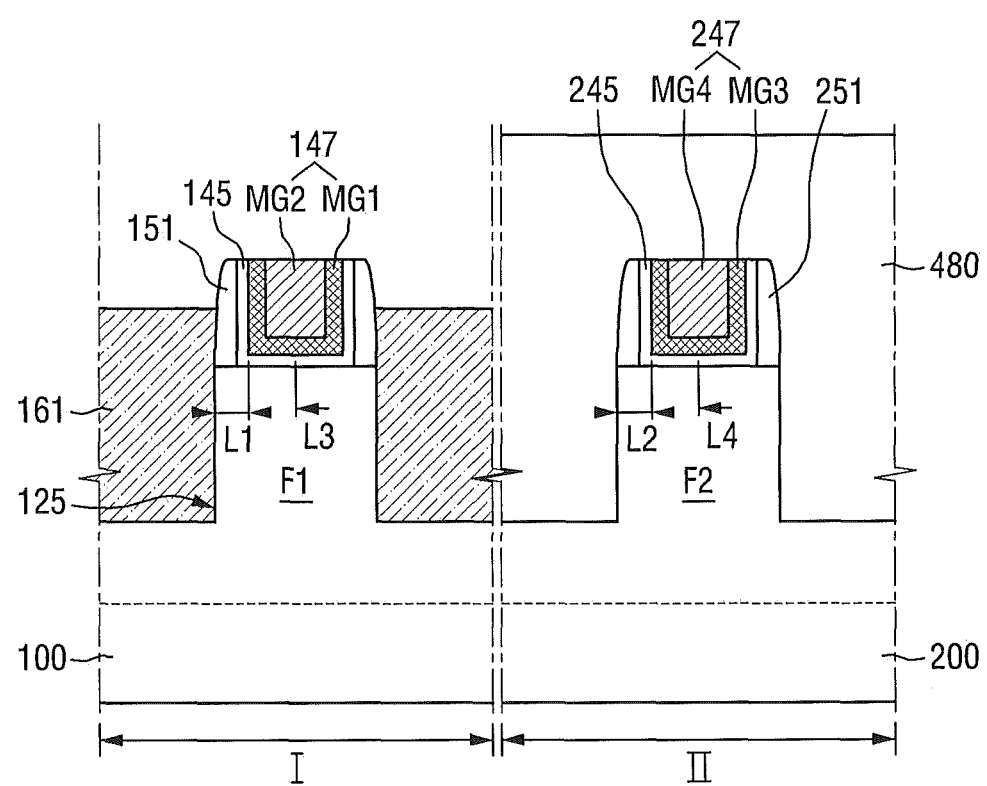

FIGS. 31 and 32 are diagrams illustrating intermediate structures provided in methods of fabricating semiconductor devices according to the embodiments of the present inventive concept. For simplicity, the following description will focus on differences from the fabrication methods described above with reference to FIGS. 14 through 26. The methods of fabricating the semiconductor devices according to the embodiment of the present inventive concept is substantially the same as the methods of fabricating the semiconductor devices according to the embodiment of the present inventive concept as shown above, except for a process of forming a recess (that is, see FIGS. 24 through 26) and a process of forming a source/drain (that is, an epitaxial process).

Referring to FIGS. 31 and 32, a first distance L1/L3 between a first gate electrode 147 (or center of the channel region) and a first recess 125 is substantially equal to a second distance L2/L4 between a second gate electrode 247 (or center of the channel region) and a second recess 225, unlike in FIGS. 24 through 26.

Referring to FIG. 32, a third mask 480 which exposes a first region I but does not expose a second region II is formed. An epitaxial process is performed while the first recess 125 is in-situ doped with impurities to a first impurity concentration. As a result, a first source/drain 161 is formed. Then, the third mask 480 is removed.

Referring to FIG. 6, a fourth mask which exposes the second region II but does not expose the first region I is formed. An epitaxial process is performed while the second recess 225 is in-situ doped with impurities to a second impurity concentration. As a result, a second source/drain 261 is formed.

Figure 33:
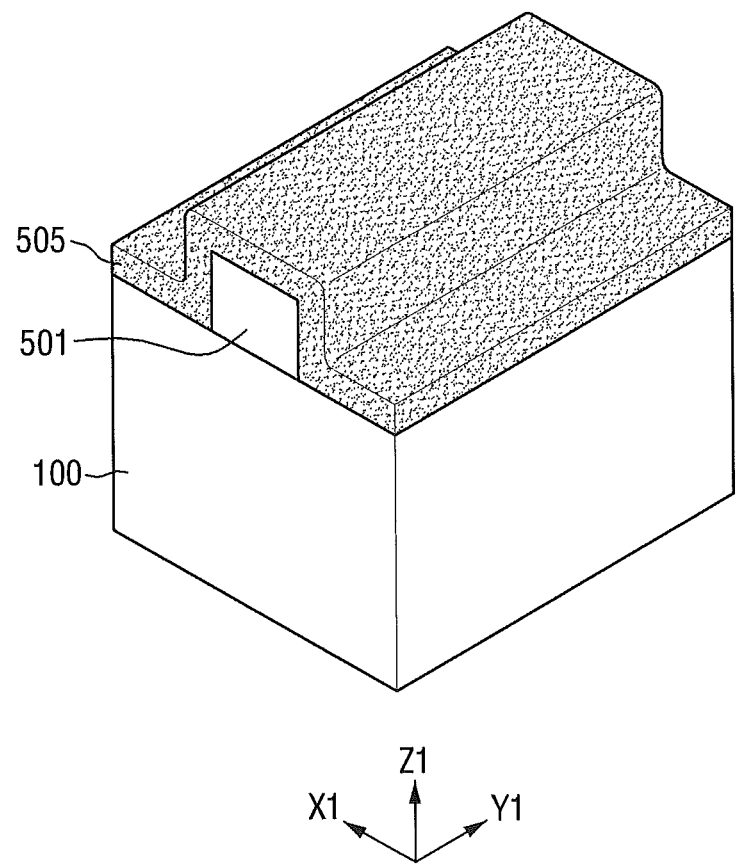
FIGS. 33 through 35 are diagrams illustrating a method of forming a fin according to some embodiments of the present inventive concept.
Figure 34:
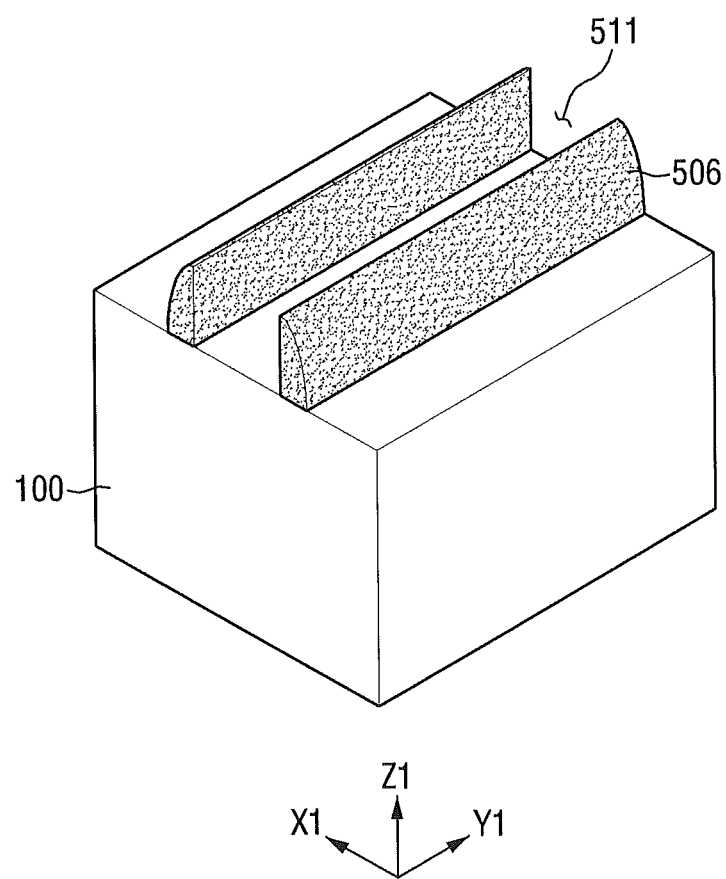
Figure 35:
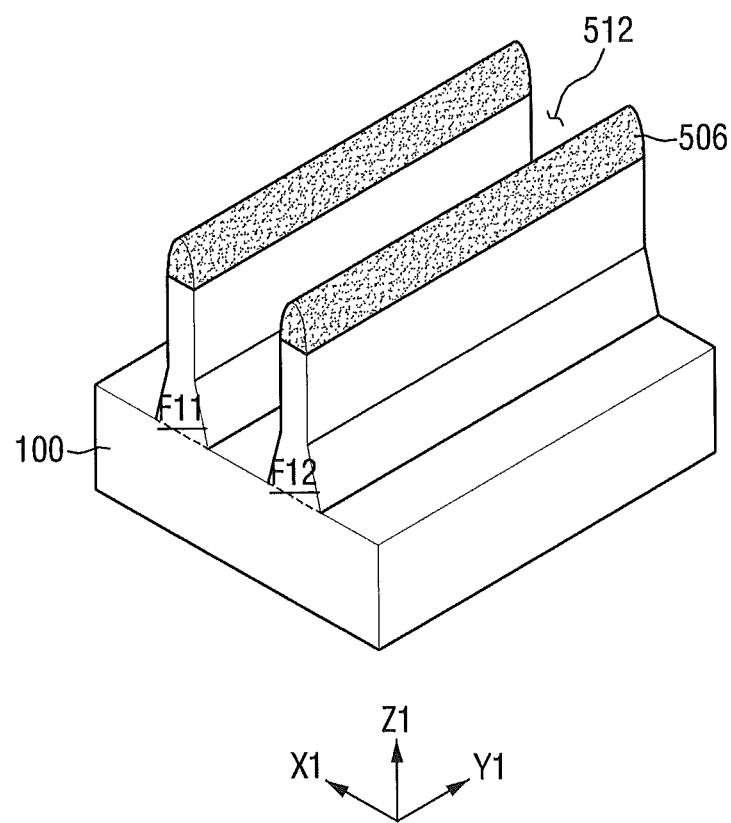

Hereinafter, methods of forming a fin usable in methods of fabricating semiconductor device according to some embodiments of the present inventive concept will be described with reference to FIGS. 33 through 35. The methods in FIGS. 33 through 35 may be methods of forming a plurality of fins illustrated in FIG. 12. The methods may include, for example, a SIT process. In FIGS. 33 through 35, methods of forming two fins are illustrated as an example. However, the present inventive concept is not limited to this example.

Referring to FIG. 33, a sacrificial pattern 501 is formed on a substrate 100. Then, a mask layer 505 is formed on the substrate 100 having the sacrificial pattern 501. The mask layer 505 may be conformally formed along a top surface of the substrate 100 having the sacrificial pattern 501. The sacrificial pattern 501 and the mask layer 505 may be made of materials that have an etch selectivity with respect to each other. For example, the mask layer 505 may include at least one of silicon oxide, silicon nitride, silicon oxynitride, photoresist, spin on glass (SOG) and spin on hard mask (SOH), and the sacrificial pattern 501 may be made of one of the above materials which is different from the material of the mask layer 505.

The sacrificial pattern 501 and the mask layer 505 may be formed by at least one of a physical vapor deposition (PVD) process, a chemical vapor deposition (CVD) process, an atomic layer deposition (ALD) process, and a spin coating process.

Referring to FIG. 34, spacer-shaped mask patterns 506 are respectively formed on side walls of the sacrificial pattern 501 using an etch-back process. Then, the sacrificial pattern 501 is removed. The mask patterns 506 may have substantially the same width. A trench 511 may be formed between the mask patterns 506.

Referring to FIG. 35, the substrate 100 is etched using the mask patterns 506 as an etch mask. As a result, fins F11 and F22 having a predetermined width may be formed. A trench 512 may be formed between the adjacent fins F11 and F12 by an etching process. In the etching process, upper parts of the mask patterns 506 may also be etched. Thus, the upper parts of the mask patterns 506 may become round.

The mask patterns 506 may be removed, thereby completing the fins F11 and F12 which are separated from each other and have the predetermined width.

Figure 36:
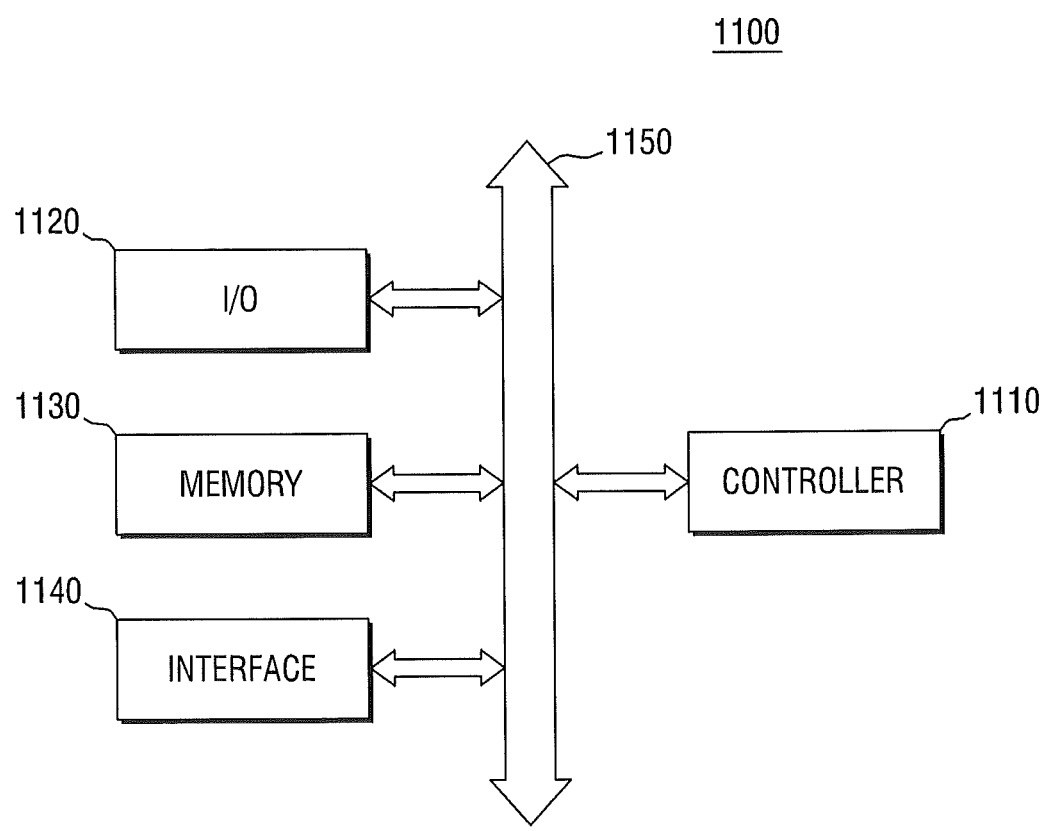
FIG. 36 is a block diagram of an electronic system 1100 including a semiconductor device according to some embodiments of the present inventive concept.

FIG. 36 is a block diagram of an electronic system 1100 including a semiconductor device according to some embodiments of the present inventive concept.

Referring to FIG. 36, the electronic system 1100 according to an embodiment of the present inventive concept may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data is transferred.

The controller 1110 may include at least one of a microprocessor, a digital signal processor, a microcontroller, or logic elements capable of performing similar functions to those of the above elements. The I/O device 1120 may include a keypad, a keyboard, and a display device. The memory device 1130 may store data and/or commands. The interface 1140 may transmit data to a communication network or receive data from the communication network. The interface 1140 can transmit data over a wire or wirelessly. For example, the interface 1140 may be an antenna or a wireless transceiver. The electronic system 1100 may further include a high-speed DRAM and/or a high-speed SRAM as an operation memory for improving the operation of the controller 1110. A fin field effect transistor according to embodiments of the present inventive concept may be provided within the memory device 1130 or provided as a part of the controller 1110 or the I/O device 1120.

The electronic system 1100 can be applied to a personal digital assistant (PDA), a portable computer, a web tablet, a wireless phone, a mobile phone, a digital music player, a memory card, and all electronic products that can transmit and/or receive information wirelessly.

Figure 37:
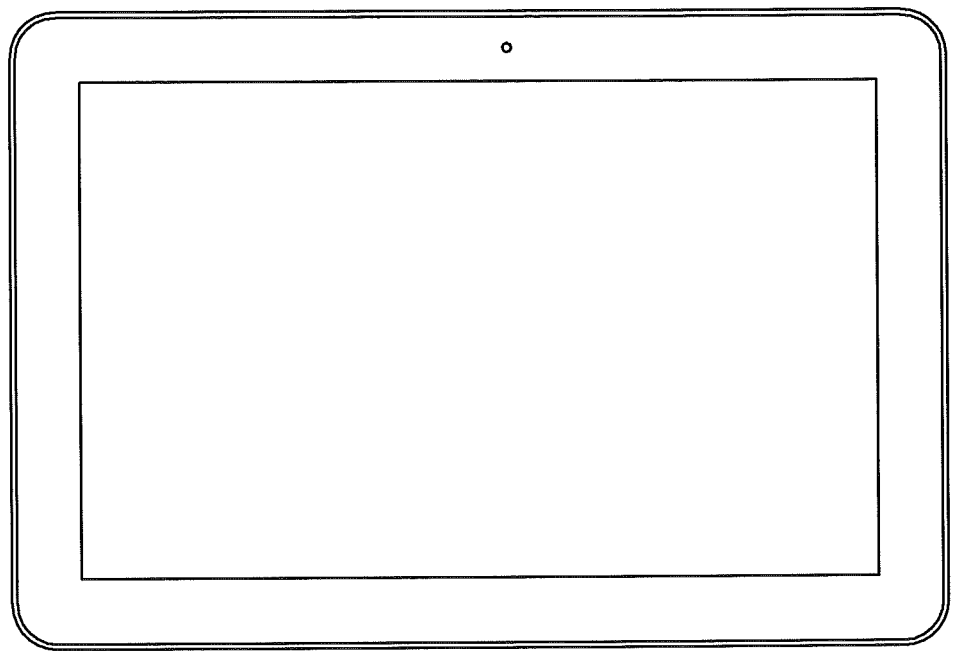
FIGS. 37 and 38 are example semiconductor systems to which semiconductor devices according to some embodiments of the present inventive concept can be applied.
Figure 38:
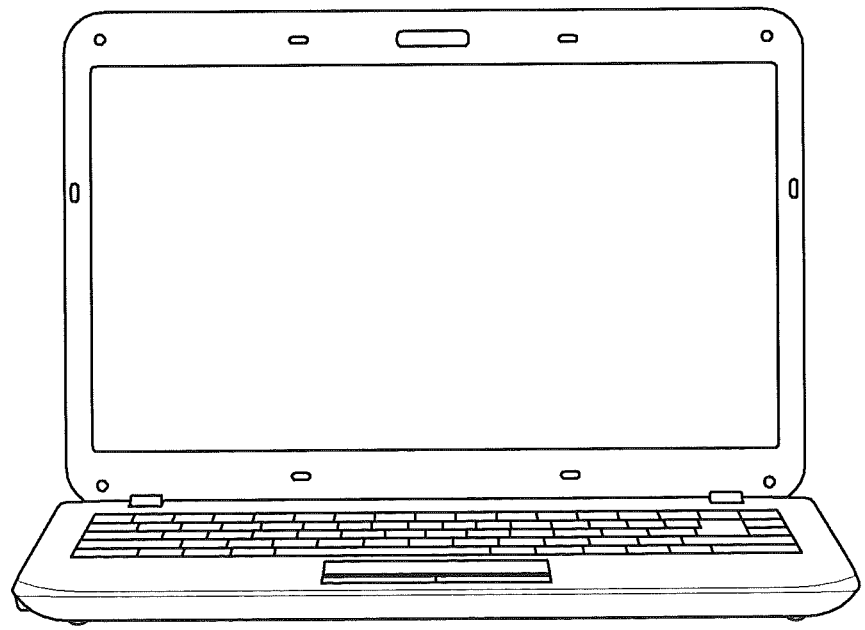

FIGS. 37 and 38 are example semiconductor systems to which semiconductor devices according to some embodiments of the present inventive concept can be applied. FIG. 37 shows a tablet PC, and FIG. 38 shows a notebook computer. At least one of the above-described semiconductor devices according to the embodiments of the present inventive concept can be used in a Tablet PC, a notebook computer, and the like. The semiconductor devices according to the embodiments of the present inventive concept are applicable to other integrated circuit devices not shown in the drawings.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. An integrated circuit comprising:
   first and second fin field effect transistors (finFETs) of same particular conductivity type on a substrate, wherein a first source/drain of the first finFET that includes electrically active impurities of a first conductivity type throughout the first source/drain is closer to a first gate electrode of the first finFET than a second source/drain of the second finFET that includes electrically active impurities of the same first conductivity type throughout the second source/drain is to a second gate electrode of the second finFET,
   wherein a first channel region of the first finFET and a second channel region of the second finFET comprise respective fins that extend from the substrate to protrude from a device isolation layer to provide upper side walls and a top surface of the respective fins positioned between the first and second source/drains, respectively,
   wherein the first gate electrode of the first finFET and the second gate electrode of the second finFET each wrap around three sides of the respective one of the first and second channel regions.

2. The circuit of claim 1 wherein a first interface of the first source/drain and the first channel region is closer to the first gate electrode than a second interface of the second source/drain and the second channel region is to the second gate electrode.

3. The circuit of claim 1 wherein the first and second source/drains comprise a particular lattice constant, and wherein the first source/drain applies greater stress to the first channel region than the second source/drain applies to the second channel region.

4. The circuit of claim 3 wherein the first source/drain extends past an outermost lower corner of a gate structure of the first finFET into the first channel region to define an undercut region beneath the first finFET; and
   wherein the second source/drain is aligned to a gate structure of the second finFET.

5. The circuit of claim 1 wherein the first and second source/drains comprise first and second raised source/drains, respectively, wherein the first source/drain extends past an outermost lower corner of a gate structure of the first finFET into the first channel region to define a first undercut region beneath the first finFET; and
   wherein the second source/drain extends past an outermost lower corner of a gate structure of the second finFET into the second channel region to define a second undercut region beneath the second finFET.

6. The circuit of claim 1 wherein the first and second source/drains comprise different lattice constants than the first and second channel regions.

7. The circuit of claim 1 wherein the first and second source/drains comprise first and second raised source/drains, respectively, wherein the first raised source/drain wraps around an outermost lower corner of a gate structure of the first finFET into the first channel region to define an undercut region beneath the first finFET; and
   wherein the second source/drain is formed aligned to a gate structure of the second finFET.

8. The circuit of claim 1 wherein the first and second source/drains comprise first and second raised source/drains, respectively, wherein the first raised source/drain wraps around an outermost lower corner of a gate structure of the first finFET into the first channel region to define a first undercut region beneath the first finFET; and
   wherein the second raised source/drain wraps around an outermost lower corner of a gate structure of the second finFET into the second channel region to define a second undercut region beneath the second finFET.

9. The circuit of claim 1 further comprising:
   a first spacer including an outer side wall of a gate structure of the first finFET to provide a first thickness; and
   a second spacer including an outer side wall of a gate structure of the second finFET to provide a second thickness that is greater than the first thickness.

10. The circuit of claim 9 wherein the first source/drain is formed self-aligned to the first spacer and the second source/drain is formed self-aligned to the second spacer.

11. The circuit of claim 9 wherein a number of layers included in the first spacer is less than a number of layers included in the second spacer.

12. The circuit of claim 11 wherein the first source/drain is formed self-aligned to the first spacer and the second source/drain is formed self-aligned to the second spacer.

13. The circuit of claim 1 wherein the first and second finFETs comprise PMOS finFETs, the first and second channel regions include a first material comprising a first lattice constant and the first and second source/drains include a second material comprising a second lattice constant that is greater than the first lattice constant.

14. The circuit of claim 13 wherein the first material comprises Si and the second material comprises SiGe.

15. The circuit of claim 1 wherein the first and second finFETs comprise NMOS finFETs, the channel regions include a first material comprising a first lattice constant and the source/drains of the first and second finFETs include a second material comprising a second lattice constant that is less than the first lattice constant.

16. The circuit of claim 15 wherein the first material comprises Si and the second material comprises SiC.

17. The circuit of claim 1 wherein at least one of the respective fins comprises a width measured between the upper side walls of about 20 nm or less.

18. The circuit of claim 17 wherein the at least one of the respective fins comprises a side wall image transfer fin.

19. The circuit of claim 1,
    wherein the first and second gate electrodes each includes a first conductive gate layer in an outer portion of the respective gate electrode and a second conductive gate layer in an inner portion of the respective gate electrode in a recess defined by the first conductive gate layer.

20. The circuit of claim 19 wherein the first and second conductive gate layers comprise first and second metal layers, respectively.

21. The circuit of claim 19 wherein the first metal layers comprise TiN, TaN, TiC, TaC, Si, or SiGe and the second metal layers comprise W and/or Al.

22. The circuit of claim 1 wherein the substrate comprises a bulk silicon or a silicon-on-insulator substrate.

23. An integrated circuit comprising:
a substrate;
a first fin field effect transistor (finFET) of a particular conductivity type on the substrate, including a first gate structure, a first source/drain that includes electrically active impurities of a first conductivity type throughout the first source/drain, and a first channel region, wherein a first interface between the first source/drain and the first channel region is aligned to the first gate structure a first distance from a first gate electrode of the first finFET, and wherein the first gate structure wraps around three sides of the first channel region; and
a second finFET of the particular conductivity type on the substrate, including a second gate structure, a second source/drain that includes electrically active impurities of the same first conductivity type throughout the second source/drain, and a second channel region, wherein the second source/drain wraps around a lower outer corner of the second gate structure to form a second interface between the second source/drain and the second channel region a second distance from a second gate electrode of the second finFET that is less than the first distance, and wherein the second gate structure wraps around three sides of the second channel region,
wherein the first and second channel regions comprise respective fins that extend from the substrate to protrude from a device isolation layer to provide upper side walls and a top surface of the respective fins positioned between the first and second source/drains, respectively,
wherein the particular conductivity type of the second finFET is the same as the particular conductivity type of the first finFET.

24. The circuit of claim 23 wherein the first and second finFETs comprise PMOS finFETs, the first and second channel regions include a first material comprising a first lattice constant and the first and second source/drains include a second material comprising a second lattice constant that is greater than the first lattice constant.

25. The circuit of claim 24 wherein the first material comprises Si and the second material comprises SiGe.

26. The circuit of claim 23 wherein the first and second finFETs comprise NMOS finFETs, the first and second channel regions include a first material comprising a first lattice constant and the first and second source/drains include a second material comprising a second lattice constant that is less than the first lattice constant.

27. The circuit of claim 26 wherein the first material comprises Si and the second material comprises SiC.

28. The circuit of claim 23 wherein the first and second gate electrodes each include a first conductive gate layer in an outer portion of the respective gate electrode and a second conductive gate layer in an inner portion of the respective gate electrode in a recess defined by the first conductive gate layer.

29. The circuit of claim 28 wherein the first and second conductive gate layers comprise first and second metal layers, respectively.

30. The circuit of claim 29 wherein the first metal layers comprise TiN, TaN, TiC, TaC, Si, or SiGe and the second metal layers comprise W and/or Al.

31. The circuit of claim 23 wherein the substrate comprises a bulk silicon or a silicon-on-insulator substrate.

32. The circuit of claim 23 wherein the first and second source/drains comprise different lattice constants than the first and second channel regions.

33. An integrated circuit comprising:
a substrate;
a first fin field effect transistor (finFET) of a particular conductivity type on the substrate, including a first gate structure, a first source/drain that includes electrically active impurities of a first conductivity type, and a first channel region, wherein the first source/drain wraps around a lower outer corner of the first gate structure to form a first interface between the first source/drain and the first channel region a first distance from a first gate electrode of the first finFET, and wherein the first gate structure wraps around three sides of the first channel region; and
a second finFET of the particular conductivity type on the substrate, including a second gate structure, a second source/drain that includes electrically active impurities of the same first conductivity type, and a second channel region, wherein the second source/drain wraps around a lower outer corner of the second gate structure to form a second interface between the second source/drain and the second channel region a second distance from a second gate electrode of the second finFET that is less than the first distance, so that the second source/drain applies greater stress to the second channel region than the first source/drain applies to the first channel region, and wherein the second gate structure wraps around three sides of the second channel region,
wherein the first and second channel regions comprise respective fins that extend from the substrate to protrude from a device isolation layer to provide upper side walls and a top surface of the respective fins positioned between the first and second source/drains, respectively, and
wherein the particular conductivity type of the second finFET is the same as the particular conductivity type of the first finFET.

34. The circuit of claim 33 wherein the first and second source/drains comprise different lattice constants than the first and second channel regions, the circuit further comprising:
a first stress film on the first finFET; and
a second stress film on the second finFET,
wherein the first stress film applies stress to the first finFET, and
wherein the second stress film applies stress to the second finFET.

35. The circuit of claim 33 wherein the first and second source/drains comprise different lattice constants than the first and second channel regions.

36. An integrated circuit comprising:
a first fin field effect transistors (finFET) of a particular conductivity type included in a logic region of a substrate; and
a second finFET, of the particular conductivity type, in a Static Random Access Memory region of the substrate, wherein a first source/drain that includes electrically active impurities of a first conductivity type of the first finFET is spaced apart from a first gate electrode of the first finFET differently than a second source/drain that includes electrically active impurities of the same first conductivity type of the second finFET is spaced apart from a second gate electrode of the second finFET,
wherein a first channel region of the first finFET and a second channel region of the second finFET comprise respective fins that extend from the substrate to protrude from a device isolation layer to provide upper side walls and a top surface of the respective fins positioned between the first and second source/drains, respectively, wherein the particular conductivity type of the second finFET is the same as the particular conductivity type of the first finFET, wherein the first gate electrode of the first finFET and the second gate electrode of the second finFET each wrap around three sides of the respective one of the first and second channel regions.

37. The circuit of claim 36 wherein a first interface between the first source/drain and the first channel region and a second interface between the second source/drain and the second channel region are separated from the first and second gate electrodes differently.

* * * * *